(12) United States Patent
Van Buskirk et al.

(10) Patent No.: US 8,748,959 B2
(45) Date of Patent: Jun. 10, 2014

(54) SEMICONDUCTOR MEMORY DEVICE

(75) Inventors: Michael A. Van Buskirk, Saratoga, CA (US); Christian Caillat, Versonnex (FR); Viktor I Koldiaev, Morgan Hill, CA (US); Jungtae Kwon, San Jose, CA (US); Pierre C. Fazan, Lonay (CH)

(73) Assignee: Micron Technology, Inc., Boise, ID (US)

( * ) Notice: Subject to any disclaimer, the term of this patent is extended or adjusted under 35 U.S.C. 154(b) by 286 days.

(21) Appl. No.: 12/751,245

(22) Filed: Mar. 31, 2010

(65) Prior Publication Data

US 2010/0259964 A1 Oct. 14, 2010

Related U.S. Application Data

(60) Provisional application No. 61/165,346, filed on Mar. 31, 2009.

(51) Int. Cl.
*H01L 27/108* (2006.01)
*H01L 21/762* (2006.01)

(52) U.S. Cl.
CPC .... *H01L 27/10802* (2013.01); *H01L 21/76264* (2013.01)
USPC ........... 257/296; 257/302; 257/397; 257/524; 257/E27.085; 257/E27.091; 257/E29.131

(58) Field of Classification Search
CPC ...... H01L 27/10802; H01L 21/762–21/76297; G11C 11/401
USPC .................. 257/242, 328, 329, 347, E29.131, 257/300–302, 395–397, 506, 524, E27.085, 257/E27.091, 296; 365/63, 174, 182, 222
See application file for complete search history.

(56) References Cited

U.S. PATENT DOCUMENTS

| | | |
|---|---|---|
| 3,439,214 A | 4/1969 | Kabell |
| 3,997,799 A | 12/1976 | Baker |

(Continued)

FOREIGN PATENT DOCUMENTS

| | | |
|---|---|---|
| CA | 272437 | 7/1927 |
| EP | 0 030 856 | 6/1981 |

(Continued)

OTHER PUBLICATIONS

Tanabe et al., A 30-ns 64-MB DRAM with Built-in-Self-Test and Self-Repair Function, IEEE Journal of Solid State Circuits, vol. 27, No. 11, pp. 1525-1533, Nov. 1992.

(Continued)

*Primary Examiner* — Allison P Bernstein
(74) *Attorney, Agent, or Firm* — Wilmer Cutler Pickering Hale and Dorr LLP

(57) ABSTRACT

A semiconductor memory device is disclosed. In one particular exemplary embodiment, the semiconductor memory device includes a plurality of memory cells arranged in an array of rows and columns. Each memory cell may include a first region connected to a source line extending in a first orientation. Each memory cell may also include a second region connected to a bit line extending a second orientation. Each memory cell may further include a body region spaced apart from and capacitively coupled to a word line, wherein the body region is electrically floating and disposed between the first region and the second region. The semiconductor device may also include a first barrier wall extending in the first orientation and a second barrier wall extending in the second orientation and intersecting with the first barrier wall to form a trench region configured to accommodate each of the plurality of memory cells.

22 Claims, 9 Drawing Sheets

(56) References Cited

U.S. PATENT DOCUMENTS

| | | |
|---|---|---|
| 4,032,947 A | 6/1977 | Kesel et al. |
| 4,250,569 A | 2/1981 | Sasaki et al. |
| 4,262,340 A | 4/1981 | Sasaki et al. |
| 4,298,962 A | 11/1981 | Hamano et al. |
| 4,371,955 A | 2/1983 | Sasaki |
| 4,527,181 A | 7/1985 | Sasaki |
| 4,630,089 A | 12/1986 | Sasaki et al. |
| 4,658,377 A | 4/1987 | McElroy |
| 4,791,610 A | 12/1988 | Takemae |
| 4,807,195 A | 2/1989 | Busch et al. |
| 4,954,989 A | 9/1990 | Auberton-Herve et al. |
| 4,979,014 A | 12/1990 | Hieda et al. |
| 5,010,524 A | 4/1991 | Fifield et al. |
| 5,144,390 A | 9/1992 | Matloubian |
| 5,164,805 A | 11/1992 | Lee |
| 5,258,635 A | 11/1993 | Nitayama et al. |
| 5,313,432 A | 5/1994 | Lin et al. |
| 5,315,541 A | 5/1994 | Harari et al. |
| 5,350,938 A | 9/1994 | Matsukawa |
| 5,355,330 A | 10/1994 | Hisamoto et al. |
| 5,388,068 A | 2/1995 | Ghoshal et al. |
| 5,397,726 A | 3/1995 | Bergemont et al. |
| 5,432,730 A | 7/1995 | Shubat et al. |
| 5,446,299 A | 8/1995 | Acovic et al. |
| 5,448,513 A | 9/1995 | Hu et al. |
| 5,466,625 A | 11/1995 | Hsieh et al. |
| 5,489,792 A | 2/1996 | Hu et al. |
| 5,506,436 A | 4/1996 | Hayashi et al. |
| 5,515,383 A | 5/1996 | Katoozi |
| 5,526,307 A | 6/1996 | Yiu et al. |
| 5,528,062 A | 6/1996 | Hsieh et al. |
| 5,568,356 A | 10/1996 | Schwartz |
| 5,583,808 A | 12/1996 | Brahmbhatt |
| 5,593,912 A | 1/1997 | Rajeevakumar |
| 5,606,188 A | 2/1997 | Bronner et al. |
| 5,608,250 A | 3/1997 | Kalnitsky |
| 5,627,092 A | 5/1997 | Alsmeier et al. |
| 5,631,186 A | 5/1997 | Park et al. |
| 5,677,867 A | 10/1997 | Hazani |
| 5,696,718 A | 12/1997 | Hartmann |
| 5,740,099 A | 4/1998 | Tanigawa |
| 5,754,469 A | 5/1998 | Hung et al. |
| 5,774,411 A | 6/1998 | Hsieh et al. |
| 5,778,243 A | 7/1998 | Aipperspach et al. |
| 5,780,906 A | 7/1998 | Wu et al. |
| 5,784,311 A | 7/1998 | Assaderaghi et al. |
| 5,798,968 A | 8/1998 | Lee et al. |
| 5,811,283 A | 9/1998 | Sun |
| 5,847,411 A | 12/1998 | Morii |
| 5,877,978 A | 3/1999 | Morishita et al. |
| 5,886,376 A | 3/1999 | Acovic et al. |
| 5,886,385 A | 3/1999 | Arisumi et al. |
| 5,897,351 A | 4/1999 | Forbes |
| 5,929,479 A | 7/1999 | Oyama |
| 5,930,648 A | 7/1999 | Yang |
| 5,936,265 A | 8/1999 | Koga |
| 5,939,745 A | 8/1999 | Park et al. |
| 5,943,258 A | 8/1999 | Houston et al. |
| 5,943,581 A | 8/1999 | Lu et al. |
| 5,960,265 A | 9/1999 | Acovic et al. |
| 5,968,840 A | 10/1999 | Park et al. |
| 5,977,578 A | 11/1999 | Tang |
| 5,982,003 A | 11/1999 | Hu et al. |
| 5,986,914 A | 11/1999 | McClure |
| 6,018,172 A | 1/2000 | Hidaka et al. |
| 6,048,756 A | 4/2000 | Lee et al. |
| 6,081,443 A | 6/2000 | Morishita |
| 6,096,598 A | 8/2000 | Furukawa et al. |
| 6,097,056 A | 8/2000 | Hsu et al. |
| 6,097,624 A | 8/2000 | Chung et al. |
| 6,111,778 A | 8/2000 | MacDonald et al. |
| 6,121,077 A | 9/2000 | Hu et al. |
| 6,133,597 A | 10/2000 | Li et al. |
| 6,157,216 A | 12/2000 | Lattimore et al. |
| 6,171,923 B1 | 1/2001 | Chi et al. |
| 6,177,300 B1 | 1/2001 | Houston et al. |
| 6,177,698 B1 | 1/2001 | Gruening et al. |
| 6,177,708 B1 | 1/2001 | Kuang et al. |
| 6,214,694 B1 | 4/2001 | Leobandung et al. |
| 6,222,217 B1 | 4/2001 | Kunikiyo |
| 6,225,158 B1 | 5/2001 | Furukawa et al. |
| 6,245,613 B1 | 6/2001 | Hsu et al. |
| 6,252,281 B1 | 6/2001 | Yamamoto et al. |
| 6,262,935 B1 | 7/2001 | Parris et al. |
| 6,292,424 B1 | 9/2001 | Ohsawa |
| 6,297,090 B1 | 10/2001 | Kim |
| 6,300,649 B1 | 10/2001 | Hu et al. |
| 6,320,227 B1 | 11/2001 | Lee et al. |
| 6,333,532 B1 | 12/2001 | Davari et al. |
| 6,333,866 B1 | 12/2001 | Ogata |
| 6,350,653 B1 | 2/2002 | Adkisson et al. |
| 6,351,426 B1 | 2/2002 | Ohsawa |
| 6,359,802 B1 | 3/2002 | Lu et al. |
| 6,384,445 B1 | 5/2002 | Hidaka et al. |
| 6,391,658 B1 | 5/2002 | Gates et al. |
| 6,403,435 B1 | 6/2002 | Kang et al. |
| 6,421,269 B1 | 7/2002 | Somasekhar et al. |
| 6,424,011 B1 | 7/2002 | Assaderaghi et al. |
| 6,424,016 B1 | 7/2002 | Houston |
| 6,429,477 B1 | 8/2002 | Mandelman et al. |
| 6,432,769 B1 | 8/2002 | Fukuda et al. |
| 6,440,872 B1 | 8/2002 | Mandelman et al. |
| 6,441,435 B1 | 8/2002 | Chan |
| 6,441,436 B1 | 8/2002 | Wu et al. |
| 6,466,511 B2 | 10/2002 | Fujita et al. |
| 6,479,862 B1 | 11/2002 | King et al. |
| 6,480,407 B1 | 11/2002 | Keeth |
| 6,492,211 B1 | 12/2002 | Divakaruni et al. |
| 6,518,105 B1 | 2/2003 | Yang et al. |
| 6,531,754 B1 | 3/2003 | Nagano et al. |
| 6,537,871 B2 | 3/2003 | Forbes |
| 6,538,916 B2 | 3/2003 | Ohsawa |
| 6,544,837 B1 | 4/2003 | Divakauni et al. |
| 6,548,848 B2 | 4/2003 | Horiguchi et al. |
| 6,549,450 B1 | 4/2003 | Hsu et al. |
| 6,552,398 B2 | 4/2003 | Hsu et al. |
| 6,552,932 B1 | 4/2003 | Cernea |
| 6,556,477 B2 | 4/2003 | Hsu et al. |
| 6,560,142 B1 | 5/2003 | Ando |
| 6,563,733 B2 | 5/2003 | Liu et al. |
| 6,566,177 B1 | 5/2003 | Radens et al. |
| 6,567,330 B2 | 5/2003 | Fujita et al. |
| 6,573,566 B2 | 6/2003 | Ker et al. |
| 6,574,135 B1 | 6/2003 | Komatsuzaki |
| 6,590,258 B2 | 7/2003 | Divakauni et al. |
| 6,590,259 B2 | 7/2003 | Adkisson et al. |
| 6,617,651 B2 | 9/2003 | Ohsawa |
| 6,621,725 B2 | 9/2003 | Ohsawa |
| 6,632,723 B2 | 10/2003 | Watanabe et al. |
| 6,650,565 B1 | 11/2003 | Ohsawa |
| 6,653,175 B1 | 11/2003 | Nemati et al. |
| 6,686,624 B2 | 2/2004 | Hsu |
| 6,703,673 B2 | 3/2004 | Houston |
| 6,707,118 B2 | 3/2004 | Muljono et al. |
| 6,714,436 B1 | 3/2004 | Burnett et al. |
| 6,721,222 B2 | 4/2004 | Somasekhar et al. |
| 6,825,524 B1 | 11/2004 | Ikehashi et al. |
| 6,861,689 B2 | 3/2005 | Burnett |
| 6,870,225 B2 | 3/2005 | Bryant et al. |
| 6,882,566 B2 | 4/2005 | Nejad et al. |
| 6,888,770 B2 | 5/2005 | Ikehashi |
| 6,894,913 B2 | 5/2005 | Yamauchi |
| 6,897,098 B2 | 5/2005 | Hareland et al. |
| 6,903,984 B1 | 6/2005 | Tang et al. |
| 6,909,151 B2 | 6/2005 | Hareland et al. |
| 6,912,150 B2 | 6/2005 | Portmann et al. |
| 6,913,964 B2 | 7/2005 | Hsu |
| 6,936,508 B2 | 8/2005 | Visokay et al. |
| 6,969,662 B2 | 11/2005 | Fazan et al. |
| 6,975,536 B2 | 12/2005 | Maayan et al. |
| 6,982,902 B2 | 1/2006 | Gogl et al. |
| 6,987,041 B2 | 1/2006 | Ohkawa |
| 7,030,436 B2 | 4/2006 | Forbes |
| 7,037,790 B2 | 5/2006 | Chang et al. |

(56) References Cited

U.S. PATENT DOCUMENTS

| | | |
|---|---|---|
| 7,041,538 B2 | 5/2006 | Ieong et al. |
| 7,042,765 B2 | 5/2006 | Sibigtroth et al. |
| 7,061,806 B2 | 6/2006 | Tang et al. |
| 7,085,153 B2 | 8/2006 | Ferrant et al. |
| 7,085,156 B2 | 8/2006 | Ferrant et al. |
| 7,170,807 B2 | 1/2007 | Fazan et al. |
| 7,177,175 B2 | 2/2007 | Fazan et al. |
| 7,187,581 B2 | 3/2007 | Ferrant et al. |
| 7,230,846 B2 | 6/2007 | Keshavarzi |
| 7,233,024 B2 | 6/2007 | Scheuerlein et al. |
| 7,256,459 B2 | 8/2007 | Shino |
| 7,301,803 B2 | 11/2007 | Okhonin et al. |
| 7,301,838 B2 | 11/2007 | Waller |
| 7,317,641 B2 | 1/2008 | Scheuerlein |
| 7,324,387 B1 | 1/2008 | Bergemont et al. |
| 7,335,934 B2 | 2/2008 | Fazan |
| 7,341,904 B2 | 3/2008 | Willer |
| 7,416,943 B2 | 8/2008 | Figura et al. |
| 7,456,439 B1 | 11/2008 | Horch |
| 7,477,540 B2 | 1/2009 | Okhonin et al. |
| 7,492,632 B2 | 2/2009 | Carman |
| 7,517,744 B2 | 4/2009 | Mathew et al. |
| 7,539,041 B2 | 5/2009 | Kim et al. |
| 7,542,340 B2 | 6/2009 | Fisch et al. |
| 7,542,345 B2 | 6/2009 | Okhonin et al. |
| 7,545,694 B2 | 6/2009 | Srinivasa Raghavan et al. |
| 7,606,066 B2 | 10/2009 | Okhonin et al. |
| 7,696,032 B2 | 4/2010 | Kim et al. |
| 2001/0055859 A1 | 12/2001 | Yamada et al. |
| 2002/0030214 A1 | 3/2002 | Horiguchi |
| 2002/0034855 A1 | 3/2002 | Horiguchi et al. |
| 2002/0036322 A1 | 3/2002 | Divakauni et al. |
| 2002/0051378 A1 | 5/2002 | Ohsawa |
| 2002/0064913 A1 | 5/2002 | Adkisson et al. |
| 2002/0070411 A1 | 6/2002 | Vermandel et al. |
| 2002/0072155 A1 | 6/2002 | Liu et al. |
| 2002/0076880 A1 | 6/2002 | Yamada et al. |
| 2002/0086463 A1 | 7/2002 | Houston et al. |
| 2002/0089038 A1 | 7/2002 | Ning |
| 2002/0098643 A1 | 7/2002 | Kawanaka et al. |
| 2002/0110018 A1 | 8/2002 | Ohsawa |
| 2002/0114191 A1 | 8/2002 | Iwata et al. |
| 2002/0130341 A1 | 9/2002 | Horiguchi et al. |
| 2002/0160581 A1 | 10/2002 | Watanabe et al. |
| 2002/0180069 A1 | 12/2002 | Houston |
| 2003/0003608 A1 | 1/2003 | Arikado et al. |
| 2003/0015757 A1 | 1/2003 | Ohsawa |
| 2003/0035324 A1 | 2/2003 | Fujita et al. |
| 2003/0042516 A1 | 3/2003 | Forbes et al. |
| 2003/0047784 A1 | 3/2003 | Matsumoto et al. |
| 2003/0057487 A1 | 3/2003 | Yamada et al. |
| 2003/0057490 A1 | 3/2003 | Nagano et al. |
| 2003/0102497 A1 | 6/2003 | Fried et al. |
| 2003/0112659 A1 | 6/2003 | Ohsawa |
| 2003/0123279 A1 | 7/2003 | Aipperspach et al. |
| 2003/0146474 A1 | 8/2003 | Ker et al. |
| 2003/0146488 A1 | 8/2003 | Nagano et al. |
| 2003/0151112 A1 | 8/2003 | Yamada et al. |
| 2003/0231521 A1 | 12/2003 | Ohsawa |
| 2004/0021137 A1 | 2/2004 | Fazan et al. |
| 2004/0021179 A1 | 2/2004 | Lee |
| 2004/0029335 A1 | 2/2004 | Lee et al. |
| 2004/0075143 A1 | 4/2004 | Bae et al. |
| 2004/0108532 A1 | 6/2004 | Forbes et al. |
| 2004/0188714 A1 | 9/2004 | Scheuerlein et al. |
| 2004/0217420 A1 | 11/2004 | Yeo et al. |
| 2005/0001257 A1 | 1/2005 | Schloesser et al. |
| 2005/0001269 A1 | 1/2005 | Hayashi et al. |
| 2005/0017240 A1 | 1/2005 | Fazan |
| 2005/0047240 A1 | 3/2005 | Ikehashi et al. |
| 2005/0062088 A1 | 3/2005 | Houston |
| 2005/0063224 A1 | 3/2005 | Fazan et al. |
| 2005/0064659 A1 | 3/2005 | Willer |
| 2005/0105342 A1 | 5/2005 | Tang et al. |
| 2005/0111255 A1 | 5/2005 | Tang et al. |
| 2005/0121710 A1 | 6/2005 | Shino |
| 2005/0135169 A1 | 6/2005 | Somasekhar et al. |
| 2005/0141262 A1 | 6/2005 | Yamada et al. |
| 2005/0141290 A1 | 6/2005 | Tang et al. |
| 2005/0145886 A1 | 7/2005 | Keshavarzi et al. |
| 2005/0145935 A1 | 7/2005 | Keshavarzi et al. |
| 2005/0167751 A1 | 8/2005 | Nakajima et al. |
| 2005/0189576 A1 | 9/2005 | Ohsawa |
| 2005/0190617 A1* | 9/2005 | Forbes et al. ................. 365/200 |
| 2005/0208716 A1 | 9/2005 | Takaura et al. |
| 2005/0226070 A1 | 10/2005 | Ohsawa |
| 2005/0232043 A1 | 10/2005 | Ohsawa |
| 2005/0242396 A1 | 11/2005 | Park et al. |
| 2005/0265107 A1 | 12/2005 | Tanaka |
| 2006/0043484 A1 | 3/2006 | Cabral et al. |
| 2006/0091462 A1 | 5/2006 | Okhonin et al. |
| 2006/0098481 A1 | 5/2006 | Okhonin et al. |
| 2006/0126374 A1 | 6/2006 | Waller et al. |
| 2006/0131650 A1 | 6/2006 | Okhonin et al. |
| 2006/0223302 A1 | 10/2006 | Chang et al. |
| 2007/0008811 A1 | 1/2007 | Keeth et al. |
| 2007/0023833 A1 | 2/2007 | Okhonin et al. |
| 2007/0045709 A1 | 3/2007 | Yang |
| 2007/0058427 A1 | 3/2007 | Okhonin et al. |
| 2007/0064489 A1 | 3/2007 | Bauser |
| 2007/0085140 A1 | 4/2007 | Bassin |
| 2007/0097751 A1 | 5/2007 | Popoff et al. |
| 2007/0114599 A1 | 5/2007 | Hshieh |
| 2007/0133330 A1 | 6/2007 | Ohsawa |
| 2007/0138524 A1 | 6/2007 | Kim et al. |
| 2007/0138530 A1 | 6/2007 | Okhonin et al. |
| 2007/0187751 A1 | 8/2007 | Hu et al. |
| 2007/0187775 A1 | 8/2007 | Okhonin et al. |
| 2007/0200176 A1 | 8/2007 | Kammler et al. |
| 2007/0252205 A1 | 11/2007 | Hoentschel et al. |
| 2007/0263466 A1 | 11/2007 | Morishita et al. |
| 2007/0278578 A1 | 12/2007 | Yoshida et al. |
| 2008/0049486 A1 | 2/2008 | Gruening-von Schwerin |
| 2008/0083949 A1 | 4/2008 | Zhu et al. |
| 2008/0099808 A1 | 5/2008 | Burnett et al. |
| 2008/0130379 A1 | 6/2008 | Ohsawa |
| 2008/0133849 A1 | 6/2008 | Demi et al. |
| 2008/0165577 A1 | 7/2008 | Fazan et al. |
| 2008/0225588 A1* | 9/2008 | Jin et al. ..................... 365/182 |
| 2008/0253179 A1 | 10/2008 | Slesazeck |
| 2008/0258206 A1 | 10/2008 | Hofmann |
| 2009/0086535 A1 | 4/2009 | Ferrant et al. |
| 2009/0121269 A1 | 5/2009 | Caillat et al. |
| 2009/0127592 A1 | 5/2009 | El-Kareh et al. |
| 2009/0129145 A1* | 5/2009 | Slesazeck ..................... 365/174 |
| 2009/0201723 A1 | 8/2009 | Okhonin et al. |
| 2010/0085813 A1 | 4/2010 | Shino |
| 2010/0091586 A1 | 4/2010 | Carman |
| 2010/0110816 A1 | 5/2010 | Nautiyal et al. |

FOREIGN PATENT DOCUMENTS

| | | |
|---|---|---|
| EP | 0 350 057 | 1/1990 |
| EP | 0 354 348 | 2/1990 |
| EP | 0 202 515 | 3/1991 |
| EP | 0 207 619 | 8/1991 |
| EP | 0 175 378 | 11/1991 |
| EP | 0 253 631 | 4/1992 |
| EP | 0 513 923 | 11/1992 |
| EP | 0 300 157 | 5/1993 |
| EP | 0 564 204 | 10/1993 |
| EP | 0 579 566 | 1/1994 |
| EP | 0 362 961 | 2/1994 |
| EP | 0 599 506 | 6/1994 |
| EP | 0 359 551 | 12/1994 |
| EP | 0 366 882 | 5/1995 |
| EP | 0 465 961 | 8/1995 |
| EP | 0 694 977 | 1/1996 |
| EP | 0 333 426 | 7/1996 |
| EP | 0 727 820 | 8/1996 |
| EP | 0 739 097 | 10/1996 |
| EP | 0 245 515 | 4/1997 |
| EP | 0 788 165 | 8/1997 |
| EP | 0 801 427 | 10/1997 |

(56) References Cited

FOREIGN PATENT DOCUMENTS

| | | |
|---|---|---|
| EP | 0 510 607 | 2/1998 |
| EP | 0 537 677 | 8/1998 |
| EP | 0 858 109 | 8/1998 |
| EP | 0 860 878 | 8/1998 |
| EP | 0 869 511 | 10/1998 |
| EP | 0 878 804 | 11/1998 |
| EP | 0 920 059 | 6/1999 |
| EP | 0 924 766 | 6/1999 |
| EP | 0 642 173 | 7/1999 |
| EP | 0 727 822 | 8/1999 |
| EP | 0 933 820 | 8/1999 |
| EP | 0 951 072 | 10/1999 |
| EP | 0 971 360 | 1/2000 |
| EP | 0 980 101 | 2/2000 |
| EP | 0 601 590 | 4/2000 |
| EP | 0 993 037 | 4/2000 |
| EP | 0 836 194 | 5/2000 |
| EP | 0 599 388 | 8/2000 |
| EP | 0 689 252 | 8/2000 |
| EP | 0 606 758 | 9/2000 |
| EP | 0 682 370 | 9/2000 |
| EP | 1 073 121 | 1/2001 |
| EP | 0 726 601 | 9/2001 |
| EP | 0 731 972 | 11/2001 |
| EP | 1 162 663 | 12/2001 |
| EP | 1 162 744 | 12/2001 |
| EP | 1 179 850 | 2/2002 |
| EP | 1 180 799 | 2/2002 |
| EP | 1 191 596 | 3/2002 |
| EP | 1 204 146 | 5/2002 |
| EP | 1 204 147 | 5/2002 |
| EP | 1 209 747 | 5/2002 |
| EP | 0 744 772 | 8/2002 |
| EP | 1 233 454 | 8/2002 |
| EP | 0 725 402 | 9/2002 |
| EP | 1 237 193 | 9/2002 |
| EP | 1 241 708 | 9/2002 |
| EP | 1 253 634 | 10/2002 |
| EP | 0 844 671 | 11/2002 |
| EP | 1 280 205 | 1/2003 |
| EP | 1 288 955 | 3/2003 |
| FR | 2 197 494 | 3/1974 |
| GB | 1 414 228 | 11/1975 |
| JP | H04-176163 A | 6/1922 |
| JP | S62-007149 A | 1/1987 |
| JP | S62-272561 | 11/1987 |
| JP | 02-294076 | 12/1990 |
| JP | 03-171768 | 7/1991 |
| JP | 05-347419 | 12/1993 |
| JP | 08-213624 | 8/1996 |
| JP | H08-213624 A | 8/1996 |
| JP | 08-274277 | 10/1996 |
| JP | H08-316337 A | 11/1996 |
| JP | 09-046688 | 2/1997 |
| JP | 09-082912 | 3/1997 |
| JP | 10-242470 | 9/1998 |
| JP | 11-087649 | 3/1999 |
| JP | 2000-247735 A | 8/2000 |
| JP | 12-274221 A | 9/2000 |
| JP | 12-389106 A | 12/2000 |
| JP | 13-180633 A | 6/2001 |
| JP | 2002-009081 | 1/2002 |
| JP | 2002-083945 | 3/2002 |
| JP | 2002-094027 | 3/2002 |
| JP | 2002-176154 | 6/2002 |
| JP | 2002-246571 | 8/2002 |
| JP | 2002-329795 | 11/2002 |
| JP | 2002-343886 | 11/2002 |
| JP | 2002-353080 | 12/2002 |
| JP | 2003-031693 | 1/2003 |
| JP | 2003-68877 A | 3/2003 |
| JP | 2003-086712 | 3/2003 |
| JP | 2003-100641 | 4/2003 |
| JP | 2003-100900 | 4/2003 |
| JP | 2003-132682 | 5/2003 |
| JP | 2003-203967 | 7/2003 |
| JP | 2003-243528 | 8/2003 |
| JP | 2004-335553 | 11/2004 |
| WO | WO 01/24268 | 4/2001 |
| WO | WO 2005/008778 | 1/2005 |

OTHER PUBLICATIONS

Arimoto et al., A Configurable Enhanced T2RAM Macro for System-Level Power Management Unified Memory, 2006, VLSI Symposium.

Arimoto, A High-Density Scalable Twin Transistor RAM (TTRAM) With Verify Control for SOI Platform Memory IPs, Nov. 2007, Solid-State Circuits.

Asian Technology Information Program (ATIP) Scoops™, "Novel Capacitorless 1T-DRAM From Single-Gate PD-SOI to Double-Gate FinDRAM", May 9, 2005, 9 pages.

Assaderaghi et al., "A Dynamic Threshold Voltage MOSFET (DTMOS) for Ultra-Low Voltage Operation", IEEE IEDM, 1994, pp. 809-812.

Assaderaghi et al., "A Dynamic Threshold Voltage MOSFET (DTMOS) for Very Low Voltage Operation", IEEE Electron Device Letters, vol. 15, No. 12, Dec. 1994, pp. 510-512.

Assaderaghi et al., "A Novel Silicon-On-Insulator (SOI) MOSFET for Ultra Low Voltage Operation", 1994 IEEE Symposium on Low Power Electronics, pp. 58-59.

Assaderaghi et al., "Dynamic Threshold-Voltage MOSFET (DTMOS) for Ultra-Low Voltage VLSI", IEEE Transactions on Electron Devices, vol. 44, No. 3, Mar. 1997, pp. 414-422.

Assaderaghi et al., "High-Field Transport of Inversion-Layer Electrons and Holes Including Velocity Overshoot", IEEE Transactions on Electron Devices, vol. 44, No. 4, Apr. 1997, pp. 664-671.

Avci, Floating Body Cell (FBC) Memory for 16-nm Technology with Low Variation on Thin Silicon and 10-nm BOX, Oct. 2008, SOI Conference.

Bae, Evaluation of 1T RAM using Various Operation Methods with SOONO (Silicon-On-ONO) device, Dec. 2008, IEDM.

Ban, A Scaled Floating Body Cell (FBC) Memory with High-k+Metal Gate on Thin-Silicon and Thin-BOX for 16-nm Technology Node and Beyond, Jun. 2008, VLSI Symposium.

Ban, Ibrahim, et al., "Floating Body Cell with Independently-Controlled Double Gates for High Density Memory," Electron Devices Meeting, 2006. IEDM '06. International, IEEE, Dec. 11-13, 2006.

Bawedin, Maryline, et al., A Capacitorless 1T Dram on SOI Based on Dynamic Coupling and Double-Gate Operation, IEEE Electron Device Letters, vol. 29, No. 7, Jul. 2008.

Blagojevic et al., Capacitorless 1T DRAM Sensing Scheme Automatice Reference Generation, 2006, IEEE J.Solid State Circuits.

Blalock, T., "A High-Speed Clamped Bit-Line Current-Mode Sense Amplifier", IEEE Journal of Solid-State Circuits, vol. 26, No. 4, Apr. 1991, pp. 542-548.

Butt, Scaling Limits of Double Gate and Surround Gate Z-RAM Cells, 2007, IEEE Trans. On El. Dev.

Chan et al., "Effects of Floating Body on Double Polysilicon Partially Depleted SOI Nonvolatile Memory Cell", IEEE Electron Device Letters, vol. 24, No. 2, Feb. 2003, pp. 75-77.

Chan, et al., "SOI MOSFET Design for All-Dimensional Scaling with Short Channel, Narrow Width and Ultra-thin Films", IEEE IEDM, 1995, pp. 631-634.

Chi et al., "Programming and Erase with Floating-Body for High Density Low Voltage Flash EEPROM Fabricated on SOI Wafers", Proceedings 1995 IEEE International SOI Conference, Oct. 1995, pp. 129-130.

Cho et al., "Novel DRAM Cell with Amplified Capacitor for Embedded Application", IEEE, Jun. 2009.

Cho, A novel capacitor-less DRAM cell using Thin Capacitively-Coupled Thyristor (TCCT), 2005, IEDM.

Choi et al., Current Flow Mechanism in Schottky-Barrier MOSFET and Application to the 1T-DRAM, 2008, SSDM.

Choi, High Speed Flash Memory and 1T-DRAM on Dopant Segregated Schottky Barrier (DSSB) FinFET SONOS Device for Multifunctional SoC Applications, Dec. 2008, IEDM.

(56) References Cited

OTHER PUBLICATIONS

Clarke, Junctionless Transistors Could Simply Chip Making, Say Researchers, EE Times, Feb. 2010, www.eetimes.com/showArticle.jhtml?articleID=223100050.
Colinge, J.P., "An SOI voltage-controlled bipolar-MOS device", IEEE Transactions on Electron Devices, vol. ED-34, No. 4, Apr. 1987, pp. 845-849.
Colinge, Nanowire Transistors Without Junctions, Nature NanoTechnology, vol. 5, 2010, pp. 225-229.
Collaert et al., Optimizing the Readout Bias for the Capacitorless 1T Bulk FinFET RAM Cell, 2009, IEEE EDL.
Collaert, Comparison of scaled floating body RAM architectures, Oct. 2008, SOI Conference.
Ershov, Optimization of Substrate Doping for Back-Gate Control in SOI T-RAM Memory Technology, 2005, SOI Conference.
Ertosun et al., A Highly Scalable Capacitorless Double Gate Quantum Well Single Transistor DRAM: 1T-QW DRAM, 2008, IEEE EDL.
Fazan et al., "A Simple 1-Transistor Capacitor-Less Memory Cell for High Performance Embedded DRAMs", IEEE 2002 Custom Integrated Circuits Conference, Jun. 2002, pp. 99-102.
Fazan, A Highly Manufacturable Capacitor-less 1T-DRAM Concept, 2002, SPIE.
Fazan, et al., "Capacitor-Less 1-Transistor DRAM", 2002 IEEE International SOI Conference, Oct. 2002, pp. 10-13.
Fazan, P., "MOSFET Design Simplifies DRAM", EE Times, May 14, 2002 (3 pages).
Fisch, Beffa, Bassin, Soft Error Performance of Z-RAM Floating Body Memory, 2006, SOI Conference.
Fisch, Carman, Customizing SOI Floating Body Memory Architecture for System Performance and Lower Cost, 2006, SAME.
Fisch, Z-RAM® Ultra-Dense Memory for 90nm and Below, 2006, Hot Chips.
Fossum et al., New Insights on Capacitorless Floating Body DRAM Cells, 2007, IEEE EDL.
Fujita, Array Architectureof Floating Body Cell (FBC) with Quasi-Shielded Open Bit Line Scheme for sub-40nm Node, 2008, SOI Conference.
Furuhashi, Scaling Scenario of Floating Body Cell (FBC) Suppressing Vth Variation Due to Random Dopant Fluctuation, Dec. 2008, SOI Conference.
Furuyama et al., "An Experimental 2-bit/Cell Storage DRAM for Macrocell or Memory-on-Logic Application", IEEE Journal of Solid-State Circuits, vol. 24, No. 2, Apr. 1989, pp. 388-393.
Giffard et al., "Dynamic Effects in SOI MOSFET's", IEEE, 1991, pp. 160-161.
Gupta et al., SPICE Modeling of Self Sustained Operation (SSO) to Program Sub-90nm Floating Body Cells, Oct. 2009, Conf on Simulation of Semiconductor Processes & Devices.
Han et al., Bulk FinFET Unified-RAM (URAM) Cell for Multifunctioning NVM and Capacitorless 1T-DRAM, 2008, IEEE EDL.
Han et al., Partially Depleted SONOS FinFET for Unified RAM (URAM) Unified Function for High-Speed 1T DRAM and Nonvolatile Memory, 2008, IEEE EDL.
Han, Energy Band Engineered Unified-RAM (URAM) for Multi-Functioning 1T-DRAM and NVM, Dec. 2008, IEDM.
Han, Parasitic BJT Read Method for High-Performance Capacitorless 1T-DRAM Mode in Unified RAM, Oct. 2009, IEEE EDL.
Hara, Y., "Toshiba's DRAM Cell Piggybacks on SOI Wafer", EE Times, Jun. 2003.
Hu, C., "SOI (Silicon-on-Insulator) for High Speed Ultra Large Scale Integration", Jpn. J. Appl. Phys. vol. 33 (1994) pp. 365-369, Part 1, No. 1B, Jan. 1994.
Idei et al., "Soft-Error Characteristics in Bipolar Memory Cells with Small Critical Charge", IEEE Transactions on Electron Devices, vol. 38, No. 11, Nov. 1991, pp. 2465-2471.
Ikeda et al., "3-Dimensional Simulation of Turn-off Current in Partially Depleted SOI MOSFETs", IEIC Technical Report, Institute of Electronics, Information and Communication Engineers, 1998, vol. 97, No. 557 (SDM97 186-198), pp. 27-34.
Inoh et al., "FBC (Floating Body Cell) for Embedded DRAM on SOI", 2003 Symposium on VLSI Circuits Digest of Technical Papers, Jun. 2003 (2 pages).
Iyer et al., "SOI MOSFET on Low Cost SPIMOX Substrate", IEEE IEDM, Sep. 1998, pp. 1001-1004.
Jang et al., Highly scalable Z-RAM with remarkably long data retention for DRAM application, Jun. 2009, VLSI.
Jeong et al., "A Capacitor-less 1T DRAM Cell Based on a Surrounding Gate MOSFET with Vertical Channel", Technology Development Team, Technology Development Team, Samsung Electronics Co., Ltd., May 2007.
Jeong et al., "A New Capacitorless 1T DRAm Cell: Surrounding Gate MOSFET with Vertical Channel (SGVC Cell)", IEEE Transactions on Nanotechnology, vol. 6, No. 3, May 2007.
Jeong et al., "Capacitorless DRAM Cell with Highly Scalable Surrounding Gate Structure", Extended Abstracts of the 2006 International Conference on Solid State Devices and Materials, pp. 574-575, Yokohama (2006).
Jeong et al., "Capacitorless Dynamic Random Access Memory Cell with Highly Scalable Surrounding Gate Structure", Japanese Journal of Applied Physics, vol. 46, No. 4B, pp. 2143-2147 (2007).
Kedzierski, J.; "Design Analysis of Thin-Body Silicide Source/Drain Devices", 2001 IEEE International SOI Conference, Oct. 2001, pp. 21-22.
Kim et al., "Chip Level Reliability on SOI Embedded Memory", Proceedings 1998 IEEE International SOI Conference, Oct. 1998, pp. 135-139.
Kuo et al., "A Capacitorless Double-Gate DRAM Cell Design for High Density Applications", IEEE IEDM, Feb. 2002, pp. 843-846.
Kuo et al., "A Capacitorless Double-Gate DRAM Cell", IEEE Electron Device Letters, vol. 23, No. 6, Jun. 2002, pp. 345-347.
Kuo et al., A Capacitorless Double Gate DRAM Technology for Sub 100 nm Embedded and Stand Alone Memory Applications, 2003, IEEE Trans. On El. Dev.
Kwon et al., "A Highly Scalable 4F2 DRAm Cell Utilizing a Doubly Gated Vertical Channel", Extended Abstracts of the 2009 International Conference on Solid State Devices and Materials, UC_Berkley, pp. 142-143 Sendai (2009).
Lee et al., "A Novel Pattern Transfer Process for Bonded SOI Giga-bit DRAMs", Proceedings 1996 IEEE International SOI Conference, Oct. 1996, pp. 114-115.
Leiss et al., dRAM Design Using the Taper-Isolated Dynamic RAM Cell, IEEE Transactions on Electron Devices, vol. ED-29, No. 4, Apr. 1982, pp. 707-714.
Lin et al., "Opposite Side Floating Gate SOI FLASH Memory Cell", IEEE, Mar. 2000, pp. 12-15.
Liu et al., Surface Generation-Recombination Processes of Gate and STI Oxide Interfaces Responsible for Junction Leakage on SOI, Sep. 2009, ECS Transactions, vol. 25.
Liu, Surface Recombination-Generation Processes of Gate, STI and Buried Oxide Interfaces Responsible for Junction Leakage on SOI, May 2009, ICSI.
Lončar et al., "One of Application of SOI Memory Cell—Memory Array", IEEE Proc. 22nd International Conference on Microelectronics (MIEL 2000), vol. 2, NIŠ, Serbia, May 14-17, 2000, pp. 455-458.
Lu et al., A Novel Two-Transistor Floating Body/Gate Cell for Low Power Nanoscale Embedded DRAM, 2008, IEEE Trans. On El. Dev.
Ma, et al., "Hot-Carrier Effects in Thin-Film Fully Depleted SOI MOSFET's", IEEE Electron Device Letters, vol. 15, No. 6, Jun. 1994, pp. 218-220.
Malhi et al., "Characteristics and Three-Dimensional Integration of MOSFET's in Small-Grain LPCVD Polycrystalline Silicon", IEEE Transactions on Electron Devices, vol. ED-32, No. 2, Feb. 1985, pp. 258-281.
Malinge, An 8Mbit DRAM Design Using a 1TBulk Cell, 2005, VLSI Circuits.
Mandelman et al, "Floating-Body Concerns for SOI Dynamic Random Access Memory (DRAM)", Proceedings 1996 IEEE International SOI Conference, Oct. 1996, pp. 136-137.

(56) References Cited

OTHER PUBLICATIONS

Matsuoka et al., FBC Potential of 6F2 Single Cell Operation in Multi Gbit Memories Confirmed by a Newly Developed Method for Measuring Signal Sense Margin, 2007, IEDM.
Minami, A Floating Body Cell (FBC) fully Compatible with 90nm CMOS Technology(CMOS IV) for 128Mb SOI DRAM, 2005, IEDM.
Mohapatra et al., Effect of Source/Drain Asymmetry on the Performance of Z-RAM0 Devices, Oct. 2009, SOI conference.
Morishita, A Capacitorless Twin-Transistor Random Access Memory (TTRAM) on SOI, 2005, CICC.
Morishita, F. et al., "A Configurable Enhanced TTRAM Macro for System-Level Power Management Unified Memory", IEEE Journal of Solid-State Circuits, vol. 42, No. 4, pp. 853, Apr. 2007.
Morishita, F., et al., "A 312-MHz 16-Mb Random-Cycle Embedded DRAM Macro With a Power-Down Data Retention Mode for Mobile Applications", J. Solid-State Circuits, vol. 40, No. 1, pp. 204-212, 2005.
Morishita, F., et al., "Dynamic floating body control SOI CMOS for power managed multimedia ULSIs", Proc. CICC, pp. 263-266, 1997.
Morishita, F., et al., "Leakage Mechanism due to Floating Body and Countermeasure on Dynamic Retention Mode of SOI-DRAM", Symposium on VLSI Technology Digest of Technical Papers, pp. 141-142, 1995.
Nagoga, Studying of Hot Carrier Effect in Floating Body Soi Mosfets by the Transient Charge Pumping Technique, Switzerland 2003.
Nayfeh, A Leakage Current Model for SOI based Floating Body Memory that Includes the Poole-Frenkel Effect, 2008, SOI Conference.
Nemati, A Novel High Density, Low Voltage SRAM Cell with a Vertical NDR Device, 1998, VLSI Tech. Symp.
Nemati, A Novel Thyristor-based SRAM Cell (T-RAM) for High-Speed, Low-Voltage, Giga-scale Memories, 1999, IEDM Conference.
Nemati, Embedded Volatile Memories-Embedded Tutorial: The New Memory Revolution, New Drives Circuits and Systems, ICCAD 2008, Nov. 2008.
Nemati, Fully Planar 0.562µm2 T-RAM Cell in a 130nm SOI CMOS Logic Technology for High-Density High-Performance SRAMs, 2004, IEDM.
Nemati, The New Memory Revolution. New Devices, Circuits and Systems, 2008, ICCAD.
Nemati, Thyristor RAM (T-RAM): A High-Speed High-Density Embedded Memory Technology for Nano-scale CMOS, 2007, Hot Chips.
Nemati, Thyristor-RAM: A Novel Embedded Memory Technology that Outperforms Embedded S RAM/DRAM, 2008, Linley Tech Tour.
Nishiguchi et al., Long Retention of Gain-Cell Dynamic Random Access Memory with Undoped Memory Node, 2007, IEEE EDL.
Oh, Floating Body DRAM Characteristics of Silicon-On-ONO (SOONO) Devices for System-on-Chip (SoC) Applications, 2007, VLSI Symposium.
Ohno et al., "Suppression of Parasitic Bipolar Action in Ultra-Thin-Film Fully-Depleted CMOS/SIMOX Devices by Ar-Ion Implantation into Source/Drain Regions", IEEE Transactions on Electron Devices, vol. 45, No. 5, May 1998, pp. 1071-1076.
Ohsawa et al., "A Memory Using One-Transistor Gain Cell on SOI (FBC) with Performance Suitable for Embedded DRAM's", 2003 Symposium on VLSI Circuits Digest of Technical Papers, Jun. 2003 (4 pages).
Ohsawa et al., "Memory Design Using a One-Transistor Gain Cell on SOI", IEEE Journal of Solid-State Circuits, vol. 37, No. 11, Nov. 2002, pp. 1510-1522.
Ohsawa, A 128Mb Floating Body RAM (FBRAM) on SOI with a Multi-Averaging Scheme of Dummy Cell, 2006 Symposium of VLSI Circuits Digest of Tech Papers, (2006).
Ohsawa, An 18.5ns 128Mb SOI DRAM with a Floating Body Cell, 2005, ISSCC.
Ohsawa, Autonomous Refresh of Floating Body Cell (FBC), Dec. 2008, IEDM.
Ohsawa, Design of a 128-Mb SOI DRAM Using the Floating Body Cell (FBC), Jan. 2006, Solid-State Circuits.
Okhonin, A Capacitor-Less 1T-DRAM Cell, Feb. 2002, Electron Device Letters.
Okhonin, A SOI Capacitor-less 1T-DRAM Concept, 2001, SOI Conference.
Okhonin, Charge Pumping Effects in Conference Partially Depleted SOI MOSFETs, 2003, SOI Conference.
Okhonin, New characterization techniques for SOI and related devices, 2003, ECCTD.
Okhonin, New Generation of Z-RAM, 2007, IEDM.
Okhonin, Principles of Transient Charge Pumping on Partially Depleted SOI MOSFETs, May 2002, Electron Device Letters.
Okhonin, Transient Charge Pumping for Partially and Fully Depleted SOI MOSFETs, 2002, SOI Conference.
Okhonin, Transient effects in PD SOI MOSFETs and potential DRAM applications, 2002, Solid-State Electronics.
Okhonin, Ultra-scaled Z-RAM cell, 2008, SOI Conference.
Okhonin, Z-RAM® (Limits of DRAM), 2009, ESSDERC.
Padilla, Alvaro, et al., "Feedback FET: A Novel Transistor Exhibiting Steep Switching Behavior at Low Bias Voltages," Electron Devices Meeting, 2008. IEDM 2008. IEEE International, Dec. 5-17, 2008.
Park, Fully Depleted Double-Gate 1T-DRAM Cell with NVM Function for High Performance and High Density Embedded DRAM, 2009, IMW.
Pelella et al., "Low-Voltage Transient Bipolar Effect Induced by Dynamic Floating-Body Charging in PD/SOI MOSFETs", Final Camera Ready Art, SOI Conference, Oct. 1995, 2 pages.
Portmann et al., "A SOI Current Memory for Analog Signal Processing at High Temperature", 1999 IEEE International SOI Conference, Oct. 1999, pp. 18-19.
Puget et al., 1T Bulk eDRAM using GIDL Current for High Speed and Low Power applications, 2008, SSDM.
Puget et al., Quantum effects influence on thin silicon film capacitor-less DRAM performance, 2006, SOI Conference.
Puget, FDSOI Floating Body Cell eDRAM Using Gate-Induced Drain-Leakage (GIDL) Write Current for High Speed and Low Power Applications, 2009, IMW.
Ranica et al., 1T-Bulk DRAM cell with improved performances: the way to scaling, 2005, ICMTD.
Ranica, A capacitor-less DRAM cell on 75nm gate length, 16nm thin Fully Depleted SOI device for high density embedded memories, 2004, IEDM.
Ranica, A One Transistor Cell on Bulk Substrate (1T-Bulk) for Low-Cost and High Density eDRAM, 2004, VLSI Symposium.
Rodder et al., "Silicon-On-Insulator Bipolar Transistors", IEEE Electron Device Letters, vol. EDL-4, No. 6, Jun. 1983, pp. 193-195.
Rodriguez, Noel, et al., A-RAM Novel Capacitor-less Dram Memory, SOI Conference, 2009 IEEE International, Oct. 5-8, 2009 pp. 1-2.
Roy, Thyristor-Based Volatile Memory in Nano-Scale CMOS, 2006, ISSCC.
Salling et al., Reliability of Thyristor Based Memory Cells, 2009, IRPS.
Sasaki et al., Charge Pumping in SOS-MOS Transistors, 1981, IEEE Trans. On El. Dev.
Sasaki et al., Charge Pumping SOS-MOS Transistor Memory, 1978, IEDM.
Schloesser et al., "A 6F2 Buried Wordline DRAM Cell for 40nm and Beyond", IEEE, Qimonda Dresden GmbH & Co., pp. 809-812 (2008).
Shino et al., Floating Body RAM technology and its scalability to 32 nm node and beyond, 2006, IEDM.
Shino et al., Operation Voltage Dependence of Memory Cell Characteristics in Fully Depleted FBC, 2005, IEEE Trans. On El. Dev.
Shino, Fully-Depleted FBC (Floating Body Cell) with Enlarged Signal Window and Excellent Logic Process Compatibility, 2004, IEDM.
Shino, Highly Scalable FBC (Floating Body Cell) with 25nm BOX Structure for Embedded DRAM Applications, 2004, VLSI Symposium.

(56) References Cited

OTHER PUBLICATIONS

Sim et al., "Source-Bias Dependent Charge Accumulation in P+-Poly Gate SOI Dynamic Random Access Memory Cell Transistors", Jpn. J. Appl. Phys. vol. 37 (1998) pp. 1260-1263, Part 1, No. 3B, Mar. 1998.

Singh, A 2ns-Read-Latency 4Mb Embedded Floating-Body Memory Macro in 45nm SOI Technology, Feb. 2009, ISSCC.

Sinha et al., "In-Depth Analysis of Opposite Channel Based Charge Injection in SOI MOSFETs and Related Defect Creation and Annihilation", Elsevier Science, Microelectronic Engineering 28, 1995, pp. 383-386.

Song, 55 nm Capacitor-less 1T DRAM Cell Transistor with Non-Overlap Structure, Dec. 2008, IEDM.

Stanojevic et al., "Design of a SOI Memory Cell", IEEE Proc. 21st International Conference on Microelectronics (MIEL '97), vol. 1, NIS, Yugoslavia, Sep. 14-17, 1997, pp. 297-300.

Su et al., "Studying the Impact of Gate Tunneling on Dynamic Behaviors of Partially-Depleted SOI CMOS Using BSIMPD", IEEE Proceedings of the International Symposium on Quality Electronic Design (ISQED '02), Apr. 2002 (5 pages).

Suma et al., "An SOI-DRAM with Wide Operating Voltage Range by CMOS/SIMOX Technology", 1994 IEEE International Solid-State Circuits Conference, pp. 138-139.

Tack et al., "The Multi-Stable Behaviour of SOI-NMOS Transistors at Low Temperatures", Proc. 1988 SOS/SOI Technology Workshop (Sea Palms Resort, St. Simons Island, GA, Oct. 1988), p. 78.

Tack et al., "The Multistable Charge Controlled Memory Effect in SOI Transistors at Low Temperatures", IEEE Workshop on Low Temperature Electronics, Aug. 7-8, 1989, University of Vermont, Burlington, pp. 137-141.

Tack et al., "The Multistable Charge-Controlled Memory Effect in SOI MOS Transistors at Low Temperatures", IEEE Transactions on Electron Devices, vol. 37, No. 5, May 1990, pp. 1373-1382.

Tack, et al., "An Analytical Model for the Misis Structure in SOI MOS Devices", Solid-State Electronics vol. 33, No. 3, 1990, pp. 357-364.

Tanaka et al., "Scalability Study on a Capacitorless 1T-DRAM: From Single-gate PD-SOI to Double-gate FINDRAM", 2004 IEEE, 4 pages.

Tang, Poren, Highly Scalable Capacitorless DRAM Cell on Thin-Body with Band-gap Engineered Source and Drain, Extended Abstracts of the 2009 ICSSDM, Sendai, 2009, pp. 144-145.

Terauchi et al., "Analysis of Floating-Body-Induced Leakage Current in 0.15 μm SOI DRAM", Proceedings 1996 IEEE International SOI Conference, Oct. 1996, pp. 138-139.

Thomas et al., "An SOI 4 Transistors Self-Refresh Ultra-Low-Voltage Memory Cell", IEEE, Mar. 2003, pp. 401-404.

Tomishima, et al., "A Long Data Retention SOI DRAM with the Body Refresh Function", IEICE Trans. Electron., vol. E80-C, No. 7, Jul. 1997, pp. 899-904.

Tsaur et al., "Fully Isolated Lateral Bipolar-MOS Transistors Fabricated in Zone-Melting-Recrystallized Si Films on SiO2", IEEE Electron Device Letters, vol. EDL-4, No. 8, Aug. 1983, pp. 269-271.

Tu, et al., "Simulation of Floating Body Effect in SOI Circuits Using BSIM3SOI", Proceedings of Technical Papers (IEEE Cat No. 97TH8303), Jun. 1997, pp. 339-342.

Villaret et al., "Mechanisms of Charge Modulation in the Floating Body of Triple-Well nMOSFET Capacitor-less DRAMs", Proceedings of the INFOS 2003, Insulating Films on Semiconductors, 13th Bi-annual Conference, Jun. 18-20, 2003, Barcelona (Spain), (4 pages).

Villaret et al., "Triple-Well nMOSFET Evaluated as a Capacitor-Less DRAM Cell for Nanoscale Low-Cost & High Density Applications", Handout at Proceedings of 2003 Silicon Nanoelectronics Workshop, Jun. 8-9, 2003, Kyoto, Japan (2 pages).

Villaret et al., Further Insight into the Physics and Modeling of Floating Body Capacitorless DRAMs, 2005, IEEE Trans. On El. Dev.

Wang et al., A Novel 4.5F2 Capacitorless Semiconductor Memory Device, 2008, IEEE EDL.

Wann et al., "A Capacitorless DRAM Cell on SOI Substrate", IEEE IEDM, 1993, pp. 635-638.

Wann et al., "High-Endurance Ultra-Thin Tunnel Oxide in MONOS Device Structure for Dynamic Memory Application", IEEE Electron Device Letters, vol. 16, No. 11, Nov. 1995, pp. 491-493.

Wei, A., "Measurement of Transient Effects in SOI DRAM/SRAM Access Transistors", IEEE Electron Device Letters, vol. 17, No. 5, May 1996, pp. 193-195.

Wouters, et al., "Characterization of Front and Back Si—SiO2 Interfaces in Thick- and Thin-Film Silicon-on-Insulator MOS Structures by the Charge-Pumping Technique", IEEE Transactions on Electron Devices, vol. 36, No. 9, Sep. 1989, pp. 1746-1750.

Wu, Dake, "Performance Improvement of the Capacitorless DRAM Cell with Quasi-SOI Structure Based on Bulk Substrate," Extended Abstracts of the 2009 ICSSDM, Sendai, 2009, pp. 146-147.

Yamanaka et al., "Advanced TFT SRAM Cell Technology Using a Phase-Shift Lithography", IEEE Transactions on Electron Devices, vol. 42, No. 7, Jul. 1995, pp. 1305-1313.

Yamauchi et al., "High-Performance Embedded SOI DRAM Architecture for the Low-Power Supply", IEEE Journal of Solid-State Circuits, vol. 35, No. 8, Aug. 2000, pp. 1169-1178.

Yamawaki, M., "Embedded DRAM Process Technology", Proceedings of the Symposium on Semiconductors and Integrated Circuits Technology, 1998, vol. 55, pp. 38-43.

Yang, Optimization of Nanoscale Thyristors on SOI for High-Performance High-Density Memories, 2006, SOI Conference.

Yoshida et al., "A Design of a Capacitorless 1-T-DRAM Cell Using Gate-induced Drain Leakage (GIDL) Current for Low-Power and High-speed Embedded Memory", 2003 IEEE, 4 pages.

Yoshida et al., "A Study of High Scalable DG-FinDRAM", IEEE Electron Device Letters, vol. 26, No. 9, Sep. 2005, pp. 655-657.

Yoshida et al., A Capacitorless 1T-DRAM Technology Using GIDL Current for Low Power and High Speed Embedded Memory, 2006, IEEE Trans. On El. Dev.

Yu et al., Hot-Carrier Effect in Ultra-Thin-Film (UTF) Fully-Depleted SOI MOSFET's, 54th Annual Device Research Conference Digest (Cat. No. 96TH8193), Jun. 1996, pp. 22-23.

Yu et al., "Hot-Carrier-Induced Degradation in Ultra-Thin-Film Fully-Depleted SOI MOSFETs", Solid-State Electronics, vol. 39, No. 12, 1996, pp. 1791-1794.

Yu et al., "Interface Characterization of Fully-Depleted SOI MOSFET by a Subthreshold I-V Method", Proceedings 1994 IEEE International SOI Conference, Oct. 1994, pp. 63-64.

Yun et al., Analysis of Sensing Margin in SOONO Device for the Capacitor-less RAM Applications, 2007, SOI Conference.

Zhou, Physical Insights on BJT-Based 1T DRAM Cells, IEEE Electron Device Letters, vol. 30, No. 5, May 2009.

International Search Report for International Patent Application No. PCT/US2010/029380 mailed May 19, 2010.

Ban et al., Integration of Back-Gate Doping for 15-nm Node Floating Body Cell (FBC) Memory, Components Research, Process Technology Modeling, Presented in the 2010 VLSI Symposium on Jun. 17, 2010.

Chinese Office Action issued in corresponding Chinese Application No. 201080014243.0, dated Sep. 29, 2013, 22 pages.

* cited by examiner

SEMICONDUCTOR MEMORY DEVICE

CROSS-REFERENCE TO RELATED APPLICATIONS

This patent application claims priority to U.S. Provisional Patent Application No. 61/165,346, filed Mar. 31, 2009, which is hereby incorporated by reference herein in its entirety.

FIELD OF THE DISCLOSURE

The present disclosure relates generally to semiconductor memory devices and, more particularly, to techniques for providing a semiconductor memory device.

BACKGROUND OF THE DISCLOSURE

The semiconductor industry has experienced technological advances that have permitted increases in density and/or complexity of semiconductor memory devices. Also, the technological advances have allowed decreases in power consumption and package sizes of various types of semiconductor memory devices. There is a continuing trend to employ and/or fabricate advanced semiconductor memory devices using techniques, materials, and devices that improve performance, reduce leakage current, and enhance overall scaling. Silicon-on-insulator (SOI) and bulk substrates are examples of materials that may be used to fabricate such semiconductor memory devices. Such semiconductor memory devices may include, for example, partially depleted (PD) devices, fully depleted (FD) devices, multiple gate devices (for example, double, triple, or surrounding gate), and Fin-FET devices.

A semiconductor memory device may include a memory cell having a memory transistor with an electrically floating body region wherein electrical charges may be stored. When excess majority electrical charge carriers are stored in the electrically floating body region, the memory cell may store a logic high (e.g., binary "1" data state). When the electrical floating body region is depleted of majority electrical charge carriers, the memory cell may store a logic low (e.g., binary "0" data state). Also, a semiconductor memory device may be fabricated on silicon-on-insulator (SOI) substrates or bulk substrates (e.g., enabling body isolation). For example, a semiconductor memory device may be fabricated as a three-dimensional (3-D) device (e.g., multiple gate devices, Fin-FETs, recessed gates and pillars).

In one conventional technique, the memory cell of the semiconductor memory device may be read by applying bias signals to a source/drain region and/or a gate of the memory transistor. As such, a conventional reading technique may involve sensing an amount of current provided/generated by/in the electrically floating body region of the memory cell in response to the application of the source/drain region and/or gate bias signals to determine a data state stored in the memory cell. For example, the memory cell may have two or more different current states corresponding to two or more different logical states (e.g., two different current conditions/states corresponding to two different logic states: a binary "0" data state and a binary "1" data state).

In another conventional technique, the memory cell of the semiconductor memory device may be written to by applying bias signals to the source/drain region(s) and/or the gate of the memory transistor. As such, a conventional writing technique may result in an increase/decrease of majority charge carriers in the electrically floating body region of the memory cell which, in turn, may determine the data state of the memory cell. An increase of majority charge carriers in the electrically floating body region may result from impact ionization, band-to-band tunneling (gate-induced drain leakage "GIDL"), or direct injection. A decrease of majority charge carriers in the electrically floating body region may result from charge carriers being removed via drain region charge carrier removal, source region charge carrier removal, or drain and source region charge carrier removal, for example, using back gate pulsing.

Often, a conventional semiconductor memory cell requires relatively large area and/or large power consumption when performing reading and/or writing operations. For example, a conventional semiconductor memory cell may be fabricated having various regions in a planar orientation and occupying a large area on a silicon-on-insulator (SOI) substrate or bulk substrate. Thus, a conventional semiconductor memory cell may have inefficient scalability and lead to an increase in the size of the semiconductor memory cell. Also, pulsing between positive and negative gate biases during read and/or write operations may result in an increase in power consumption of the conventional semiconductor memory cell.

In view of the foregoing, it may be understood that there may be significant problems and shortcomings associated with conventional floating body semiconductor memory devices.

SUMMARY OF THE DISCLOSURE

Techniques for providing a semiconductor memory device are disclosed. In one particular exemplary embodiment, the techniques may be realized as a semiconductor memory device comprising a plurality of memory cells arranged in an array of rows and columns. Each memory cell may include a first region connected to a source line extending in a first orientation. Each memory cell may also include a second region connected to a bit line extending a second orientation. Each memory cell may further include a body region spaced apart from and capacitively coupled to a word line, wherein the body region is electrically floating and disposed between the first region and the second region. The semiconductor device may also comprise a first barrier wall extending in the first orientation of the array and a second barrier wall extending in the second orientation of the array and intersecting with the first barrier wall to form a trench region configured to accommodate each of the plurality of memory cells.

In accordance with other aspects of the particular exemplary embodiment, the first region and the second region may be N-doped regions.

In accordance with further aspects of this particular exemplary embodiment, the body region may be an P-doped region.

In accordance with additional aspects of this particular exemplary embodiment, the body region may be an undoped region.

In accordance with additional aspects of this particular exemplary embodiment, the first barrier wall and the second barrier wall may be formed of an insulating oxide material.

In accordance with yet another aspect of this particular exemplary embodiment, the first barrier wall and the second barrier wall may be formed on a P-type substrate.

In accordance with other aspects of the particular exemplary embodiment, the word line may be disposed along a side of the body region.

In accordance with further aspects of this particular exemplary embodiment, a height of the word line may be similar to a height of the body region.

In accordance with additional aspects of this particular exemplary embodiment, the word line may be disposed adjacent to a side of the body region and a side of at least a portion of the first region.

In accordance with additional aspects of this particular exemplary embodiment, the word line may be disposed along a side of the body region and a side of at least a portion of the second region.

In accordance with yet another aspect of this particular exemplary embodiment, the word line may be disposed along a side of the body region, at least a portion of a side of the first region, and at least a portion of a side of the second region.

In accordance with other aspects of the particular exemplary embodiment, a height of the word line may be shorter than a height of the body region.

In accordance with further aspects of this particular exemplary embodiment, the word line may have a rectangular cross-sectional shape.

In accordance with additional aspects of this particular exemplary embodiment, the word line may have a U cross-sectional shape.

In accordance with additional aspects of this particular exemplary embodiment, the word line may have an L cross-sectional shape.

In accordance with yet another aspect of this particular exemplary embodiment, the word line may be capacitively coupled to a plurality of the body regions.

In accordance with other aspects of the particular exemplary embodiment, the word line may be coupled to a constant voltage potential.

In accordance with further aspects of this particular exemplary embodiment, the word line may be coupled to a ground voltage potential.

In accordance with additional aspects of this particular exemplary embodiment, the array of memory cells may comprise a dummy row of memory cells separating adjacent rows of the memory cells.

In accordance with additional aspects of this particular exemplary embodiment, the source line may extend in the first orientation configured in a plane below the first region.

In accordance with yet another aspect of this particular exemplary embodiment, the bit line may extend in the second orientation configured in a plane above the second region.

In accordance with other aspects of the particular exemplary embodiment, the bit line may be connected to the second region via a bit line contact.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

Figure 1:
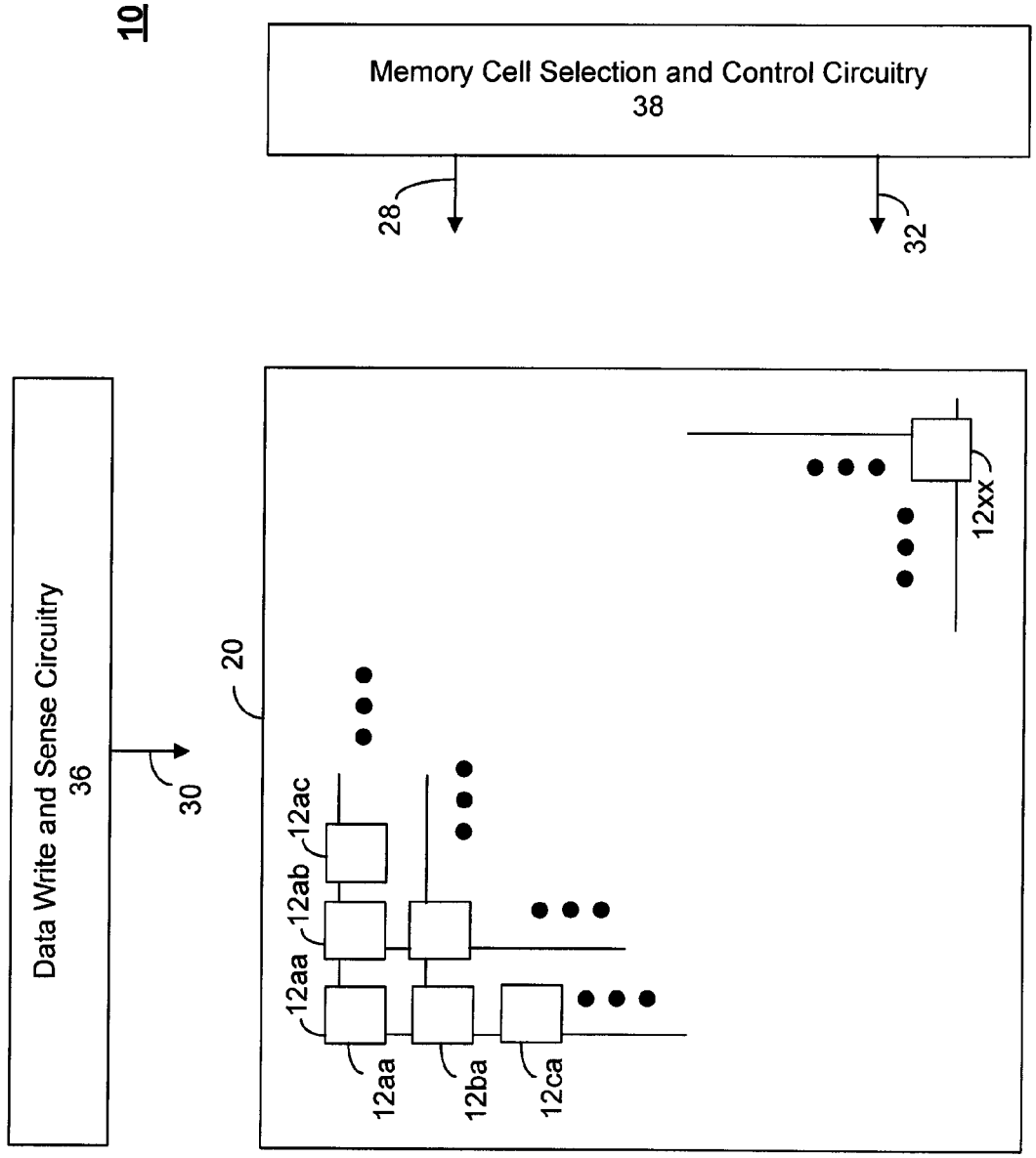
FIG. 1 shows a schematic block diagram of a semiconductor memory device including a memory cell array, data write and sense circuitry, and memory cell selection and control circuitry in accordance with an embodiment of the present disclosure.

Referring to FIG. 1, there is shown a schematic block diagram of a semiconductor memory device 10 comprising a memory cell array 20, data write and sense circuitry 36, and memory cell selection and control circuitry 38 in accordance with an embodiment of the present disclosure. The memory cell array 20 may comprise a plurality of memory cells 12 each connected to the memory cell selection and control circuitry 38 via a word line (WL) 28 and/or a source line (EN) 32, and the data write and sense circuitry 36 via a bit line (CN) 30. It may be appreciated that the bit line (CN) 30 and the source line (EN) 32 are designations used to distinguish between two signal lines and they may be used interchangeably. The data write and sense circuitry 36 may read data from and may write data to selected memory cells 12. In an exemplary embodiment, the data write and sense circuitry 36 may include a plurality of data sense amplifiers. Each data sense amplifier may receive at least one bit line (CN) 30 and a current or voltage reference signal. For example, each data sense amplifier may be a cross-coupled type sense amplifier to sense a data state stored in a memory cell 12.

Each data sense amplifier may employ voltage and/or current sensing circuitry and/or techniques. In an exemplary embodiment, each data sense amplifier may employ current sensing circuitry and/or techniques. For example, a current sense amplifier may compare current from a selected memory cell 12 to a reference current (e.g., the current of one or more reference cells). From that comparison, it may be determined whether the selected memory cell 12 contains a logic high (e.g., binary "1" data state) or a logic low (e.g., binary "0" data state). It may be appreciated by one having ordinary skill in the art that various types or forms of data write and sense circuitry 36 (including one or more sense amplifiers, using voltage or current sensing techniques, using or not reference cells, to sense a data state stored in a memory cell 12) may be employed to read data stored in memory cells 12 and/or write data to memory cells 12.

Also, the memory cell selection and control circuitry 38 may select and/or enable one or more predetermined memory cells to facilitate reading data therefrom and/or writing data thereto by applying control signals on one or more word lines (WL) 28 and/or source lines (EN) 32. The memory cell selection and control circuitry 38 may generate such control signals from address signals, for example, row address signals. Moreover, the memory cell selection and control circuitry 38 may include a word line decoder and/or driver. For example, the memory cell selection and control circuitry 38 may include one or more different control/selection techniques (and circuitry therefore) to select and/or enable one or more predetermined memory cells 12. Notably, all such control/selection techniques, and circuitry therefore, whether now known or later developed, are intended to fall within the scope of the present disclosure.

In an exemplary embodiment, the semiconductor memory device 10 may implement a two step write operation whereby all the memory cells 12 in an active row of memory cells 12 are first written to a logic low (e.g., binary "0" data state) by executing a "clear" or a logic low (e.g., binary "0" data state) write operation. Thereafter, selected memory cells 12 in the active row of memory cells 12 may be selectively written to a logic high (e.g., binary "1" data state) by executing a logic high (e.g., binary "1" data state) write operation. The semiconductor memory device 10 may also implement a one step write operation whereby selected memory cells 12 in an active row of memory cells 12 may be selectively written to either a logic high (e.g., binary "1" data state) or a logic low (e.g., binary "0" data state) without first implementing a "clear" operation. The semiconductor memory device 10 may employ any of the exemplary writing, refreshing, holding, and/or reading techniques described herein.

The memory cells 12 may comprise N-type, P-type and/or both types of transistors. Circuitry that is peripheral to the memory array 20 (for example, sense amplifiers or comparators, row and column address decoders, as well as line drivers (not illustrated herein)) may also include P-type and/or N-type transistors. Regardless of whether P-type transistors or N-type transistors are employed in memory cells 12 in the memory array 20, suitable voltage potentials (for example, positive or negative voltage potentials) for reading from and/or writing to the memory cells 12 should be well known to those skilled in the art in light of this disclosure. Accordingly, for sake of brevity, a discussion of such suitable voltage potentials will not be included herein.

Figure 2:
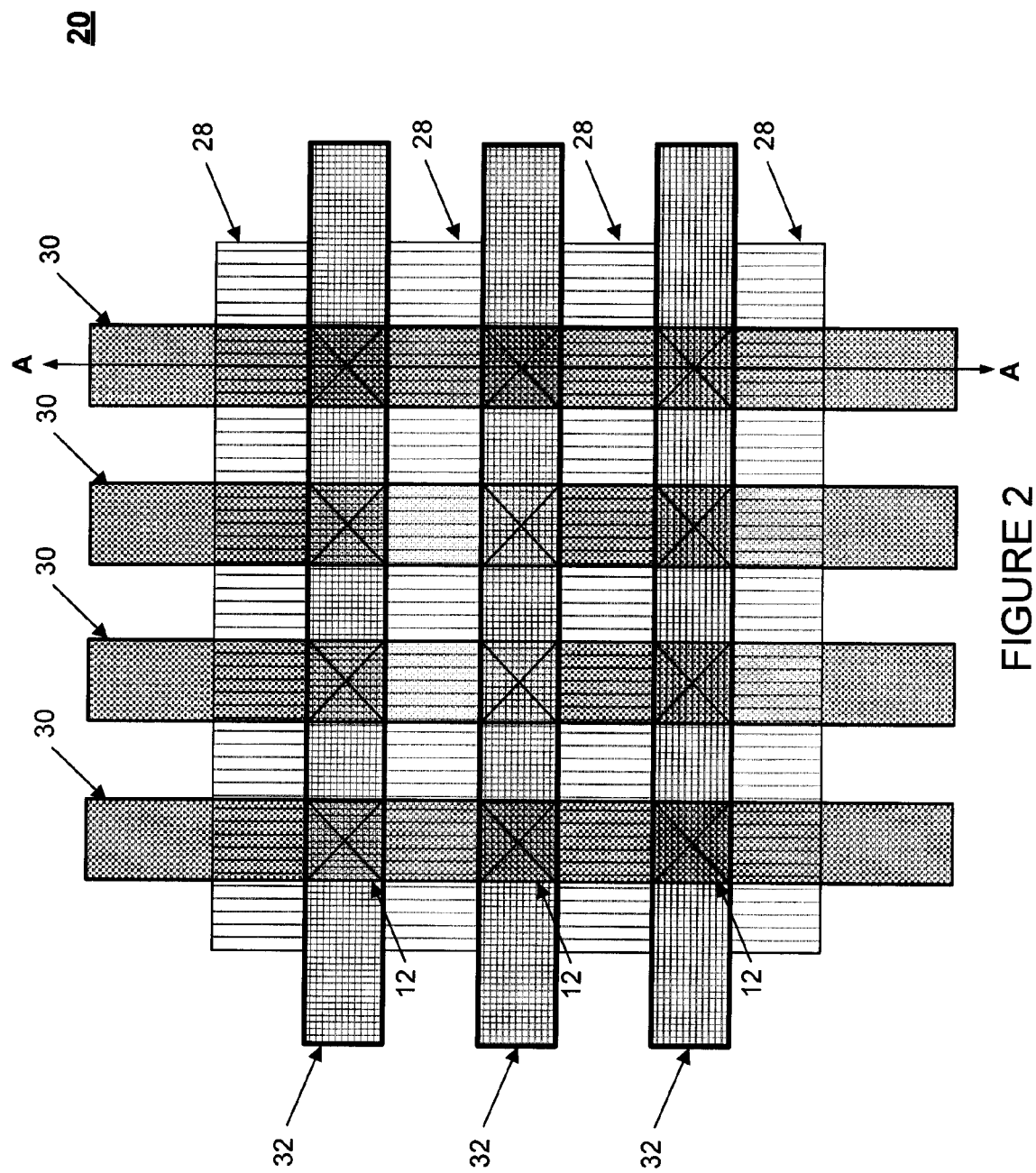
FIG. 2 shows a top view of a portion of a memory cell array having a plurality of memory cells in accordance with an embodiment of the present disclosure.

Referring to FIG. 2, there is shown a top view of a portion of the memory cell array 20 having a plurality of memory cells 12 in accordance with an embodiment of the present disclosure. As illustrated in the top view, the memory cell array 20 may include a plurality of memory cells 12 arranged in a matrix of rows and columns including a plurality of word lines 28 (WL), a plurality of bit lines (CN) 30, and a plurality of source lines (EN) 32. Each bit line (CN) 30 may extend in a first orientation along a first plane of the memory cell array 20. Each source line (EN) 32 may extend in a second orientation along a second plane of the memory cell array 20. Each word line (WL) 28 may extend in the second orientation along a third plane of the memory cell array 20. The first plane, the second plane, and a third plane may be arranged in different planes parallel to each other.

Figure 3:
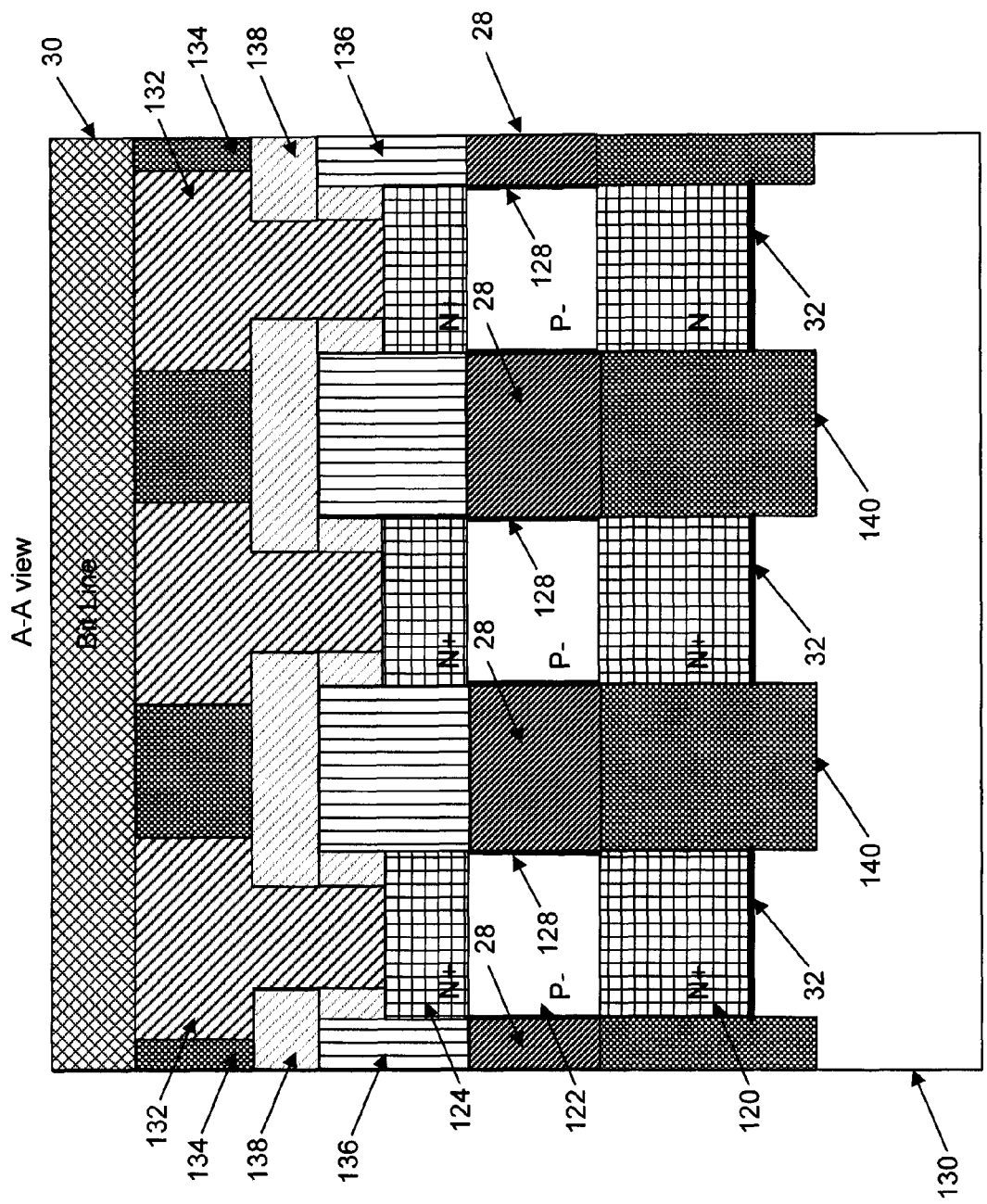
FIG. 3 shows a cross-sectional view of a portion of a memory cell array having a plurality of memory cells in accordance with an embodiment of the present disclosure.

Referring to FIG. 3, there is shown a cross-sectional view of a portion of the memory cell array 20 having a plurality of memory cells 12 in accordance with an embodiment of the present disclosure. For example, FIG. 3 illustrates a cross-sectional view taken along line (A-A) of the top view shown in FIG. 2. The cross-sectional view may illustrate a column of memory cells 12 in the memory cell array 20. In an exemplary embodiment, each row and/or column of the memory cell array 20 may include a plurality of memory cells 12. Each memory cell 12 may comprise an N+ source region 120, a P− body region 122, and an N+ drain region 124. The N+ source region 120, the P− body region 122, and/or the N+ region 124, may be disposed in sequential contiguous relationship in a pillar or fin configuration, and may extend vertically or perpendicularly to a plane defined by a P− substrate 130.

In an exemplary embodiment, the N+ source region 120 may be formed of a semiconductor material (e.g., silicon) comprising donor impurities (e.g., nitrogen, arsenic, and/or phosphorus) and connected to the source line (EN) 32. In an exemplary embodiment, the source line (EN) 32 may be formed of a metal layer. In another exemplary embodiment, the source line (EN) 32 may be formed of a polycide layer (e.g., a combination of a metal material and a silicon material). In another exemplary embodiment, the source line (EN) 32 may be formed of a N+ doped silicon layer. The source line (EN) 32 may be connected to a plurality of memory cells 12 (e.g., a row of memory cells 12). For example, the source line (EN) 32 may be formed below the N+ source region 120. In another exemplary embodiment, the source line (EN) 32 may be formed on a side of the N+ source region 120.

In an exemplary embodiment, the P− body region 122 may be an electrically floating body region of the memory cell 12 configured to accumulate/store charges, and may be spaced apart from and capacitively coupled to the word line (WL) 28. In an exemplary embodiment, the P− body region 122 may be formed of a semiconductor material (e.g., intrinsic silicon) comprising acceptor impurities. For example, the P− body region 122 may be formed of a silicon material doped with boron impurities. In another exemplary embodiment, the P− body region 122 may be formed of a semiconductor material (e.g., intrinsic silicon). In other exemplary embodiments, the P− body region 122 may be formed of an undoped semiconductor material.

The word line (WL) 28 may be formed of a polycide layer or a metal layer. The word line (WL) 28 may be oriented in a row direction of the memory cell array 20 and connected to a plurality of memory cells 12. The word line (WL) 28 may be arranged between two contiguous memory cells 12 (e.g., memory cells 12 located on different rows of the memory cell array 20). The word line (WL) 28 may be shared between two contiguous memory cells 12 in a column direction. In an exemplary embodiment, the word line (WL) 28 may have a height similar to or equal to the height of the P− body region 122 in order to reduce disturbance that may be caused by the word line (WL) 28. In another exemplary embodiment, the word line (WL) 28 may have a height extending beyond the height of the P− body region 122. For example, the word line (WL) 28 may have a height extending past a bottom region of the P− body region 122 to be adjacent to a top region of the N+ source region 120. In another exemplary embodiment, the word line (WL) 28 may have a height extending past a top region of the P− body region 122 to be adjacent to a bottom region of the N+ drain region 124. In other exemplary embodiments, the word line (WL) 28 may have a height extending past both a bottom region and a top region of the P− body region 122 to be adjacent to a top region of the N+ source region 120 and a bottom region of the N+ drain region 124, respectively.

Also, the word line (WL) 28 may have a height shorter than a height of the P– body region 122. In an exemplary embodiment, a bottom region of the word line (WL) 28 may be flushed with a bottom region of the P– body region 122 while a top region of the word line (WL) 28 may be below a top region of the P– body region 122. In another exemplary embodiment, a top region of the word line (WL) 28 may be flushed with a top region of the P– body region 122 while a bottom region of the word line (WL) 28 may be above a bottom region of the P– body region 122. In other exemplary embodiments, a top region of the word line (WL) 28 may be below a top region of the P– body region 122 and a bottom region of the word line (WL) 28 may be above a bottom region of the P– body region 122.

The P– body region 122 and the word line (WL) 28 may be capacitively coupled via an insulating or dielectric region 128. The insulating or dielectric region 128 may be formed of an insulating material, a dielectric material, or a combination of insulating and dielectric materials. In an exemplary embodiment, the insulating or dielectric region 128 may be arranged on one or more sides of the P– body region 122 to capacitively couple the P– body region 122 to the word line (WL) 28. In another exemplary embodiment, the insulating or dielectric region 128 may circumferentially surround the P– body region 122 in order to capacitively couple the word line (WL) 28 to the P– body region 122.

In an exemplary embodiment, the N+ drain region 124 of the memory cell 12 may be connected to the bit line (CN) 30. In an exemplary embodiment, the N+ drain region 124 may be formed of a semiconductor material (e.g., silicon) comprising donor impurities (e.g., nitrogen, arsenic, and/or phosphorus). In an exemplary embodiment, the bit line (CN) 30 may be formed of a polycide layer. In another exemplary embodiment, the bit line (CN) 30 may be formed of a metal layer. For example, the bit line (CN) 30 may be formed of aluminum, copper, tungsten, titanium, titanium nitride, and/or a combination thereof. In another exemplary embodiment, the bit line (CN) 30 may be formed of a doped polysilicon layer.

The bit line (CN) 30 may be connected to a plurality of memory cells 12 (e.g., a column of memory cells 12) via a plurality of bit line contacts 132. For example, each bit line contact 132 may correspond to a memory cell 12 along a column direction of the memory cell array 20. Each bit line contact 132 may be formed of a metal layer or a polysilicon layer in order to couple a predetermined voltage potential from the bit line (CN) 30 to the N+ drain region 124 of the memory cell 12. For example, the bit line contact 132 may be formed of tungsten, titanium, titanium nitride, polysilicon or a combination thereof. The bit line contact 132 may have a height extending from the bit line (CN) 30 to the N+ drain region 124 of the memory cell 12. The plurality of bit line contacts 132 along the column direction of the memory cell array 20 may be separated from each other via a dielectric material 134. In an exemplary embodiment, the dielectric material 134 may be formed from silicon nitride in order to isolate the memory cells 12 along the column direction of the memory cell 12.

The bit line contact 132 may be isolated from the word line (WL) 28 via an insulator/dielectric material 136. The insulator/dielectric material may be formed of a silicon nitride or silicon dioxide material in order to reduce disturbance of a voltage potential applied on the word line (WL) 28 from a voltage potential applied on the bit line (CN) 30. In an exemplary embodiment, an interface layer 138 may be provided between the bit line contact 132 and the insulator/dielectric material 136 in order to obtain a reliable contact between the bit line contact 132 and the insulator/dielectric material 136. The interface layer 138 may be arranged on a top region and/or side regions of the insulator/dielectric material 136. The interface layer 138 may be formed, for example, of an insulating material (e.g., silicon nitride or silicon dioxide).

In an exemplary embodiment, the P– substrate 130 may be made of a semiconductor material (e.g., silicon) comprising acceptor impurities and may form a base of the memory cell array 20. In alternative exemplary embodiments, a plurality of P– substrates 130 may form the base of the memory cell array 20 or a single P– substrate 130 may form the base of the memory cell array 20. Also, the P– substrate 130 may be made in the form of a P-well substrate.

A plurality of barrier walls 140 may be formed on the P– substrate 130. For example, the plurality of barrier walls 140 may be formed of an insulating material. In an exemplary embodiment, the plurality of barrier walls 140 may be formed of an insulating oxide material. The plurality of barrier walls 140 may be oriented in a column direction and a row direction of the memory cell array 20. For example, a first barrier wall 140 of the plurality of barrier walls 140 may be oriented in a column direction. A second barrier wall 140 of the plurality of barrier walls 140 may be oriented in a row direction. In an exemplary embodiment, the first barrier wall 140 oriented in the column direction and the second barrier wall 140 oriented in the row direction may intersect to form a trench region. The trench region may have a cross-sectional shape that may accommodate the memory cell 12 therein. For example, the trench region may have a cross-sectional shape of a square, a rectangle, a cylinder, and/or other shapes that may accommodate the memory cell 12. The height of the barrier walls 140 may be dependent upon the height of the word line (WL) 28. For example, the barrier walls 140 may have a height extending shorter than the height of the N+ source region 120 when the word line (WL) 28 has a height extending past a bottom region of the P– body region 122 to be adjacent to a top region of the N+ source region 120. In another exemplary embodiment, the barrier walls 140 may have a similar height as the N+ source region 120 when the word line (WL) 28 has similar height as the P– body region 122. In other exemplary embodiments, the barrier walls 140 may have a height taller than the height of the N+ source region 120 when the word line (WL) 28 has a height that does not extend past a bottom region of the P– body region 122.

Figure 4:
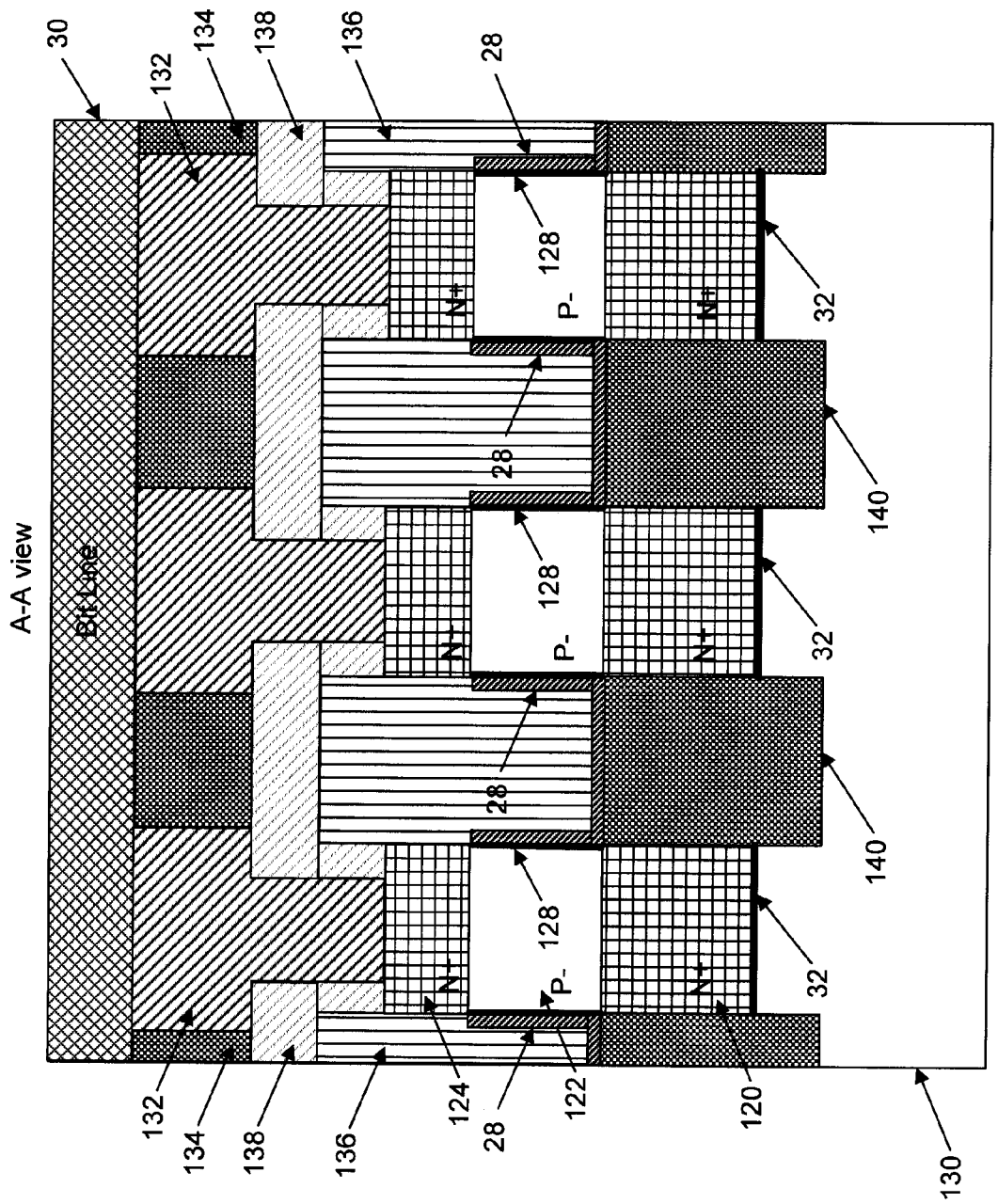
FIG. 4 shows a cross-sectional view of a portion of a memory cell array having a plurality of memory cells in accordance with a first alternative embodiment of the present disclosure.

Referring to FIG. 4, there is shown a cross-sectional view of a portion of the memory cell array 20 having a plurality of memory cells 12 in accordance with a first alternative embodiment of the present disclosure. FIG. 4 illustrates a sectional view of a column of memory cells 12 in the memory cell array 20 similar to the sectional view shown in FIG. 3, except for an alternative word line (WL) 28 configuration. In an exemplary embodiment, the word line (WL) 28 may be formed of a metal or conductive layer having an "U" cross sectional shape. In an exemplary embodiment, the word line (WL) 28 may be formed of two side portions with an interconnecting bottom portion connecting the two side portions. The word line (WL) 28 may be arranged between two contiguous memory cells 12 (e.g., memory cells 12 located on different rows of the memory cell array 20). The word line (WL) 28 may be shared between two contiguous memory cells 12 in a column direction. For example, each side portion of the word line (WL) 28 may be capacitively coupled to a respective P– body region 122 via a respective insulating or dielectric region 128. Thus, the two side portions of the word line (WL) 28 may be connected to each other via a bottom portion so that two contiguous memory cells 12 may share a word line (WL) 28.

The word line (WL) 28 may have a predetermined height to apply a voltage potential in order to perform one or more operations (e.g., read, write, refresh, and/or other active operation) on the memory cells 12. In an exemplary embodiment, each side portion of the word line (WL) 28 may have a height similar to or equal to the height of a respective P− body region 122. In another exemplary embodiment, each side portion of the word line (WL) 28 may have a height extending beyond the height of a respective P− body region 122. For example, each side portion of the word line (WL) 28 may have a height extending past a bottom region of the P− body region 122 to be adjacent to a top region of the N+ source region 120. In another exemplary embodiment, each side portion of the word line (WL) 28 may have a height extending past a top region of the P− body region 122 to be adjacent to a top region of the N+ drain region 124. In other exemplary embodiments, each side portion of the word line (WL) 28 may have a height extending past both a bottom region and a top region of the P− body region 122 to be adjacent to a top region of the N+ source region 120 and a bottom region of the N+ drain region 124, respectively.

Also, each side portion of the word line (WL) 28 may have a height shorter than a height of the P− body region 122. In an exemplary embodiment, a bottom region of each side portion of the word line (WL) 28 may be flushed with a bottom region of the P− body region 122 while a top region of each side portion of the word line (WL) 28 may be below a top region of the P− body region 122. In another exemplary embodiment, a top region of each side portion of the word line (WL) 28 may be flushed with a top region of the P− body region 122 while a bottom region of each side portion of the word line (WL) 28 may be above a bottom region of the P− body region 122. In other exemplary embodiments, a top region of each side portion of the word line (WL) 28 may be below a top region of the P− body region 122 and a bottom region of each side portion of the word line (WL) 28 may be above a bottom region of the P− body region 122.

Figure 5:
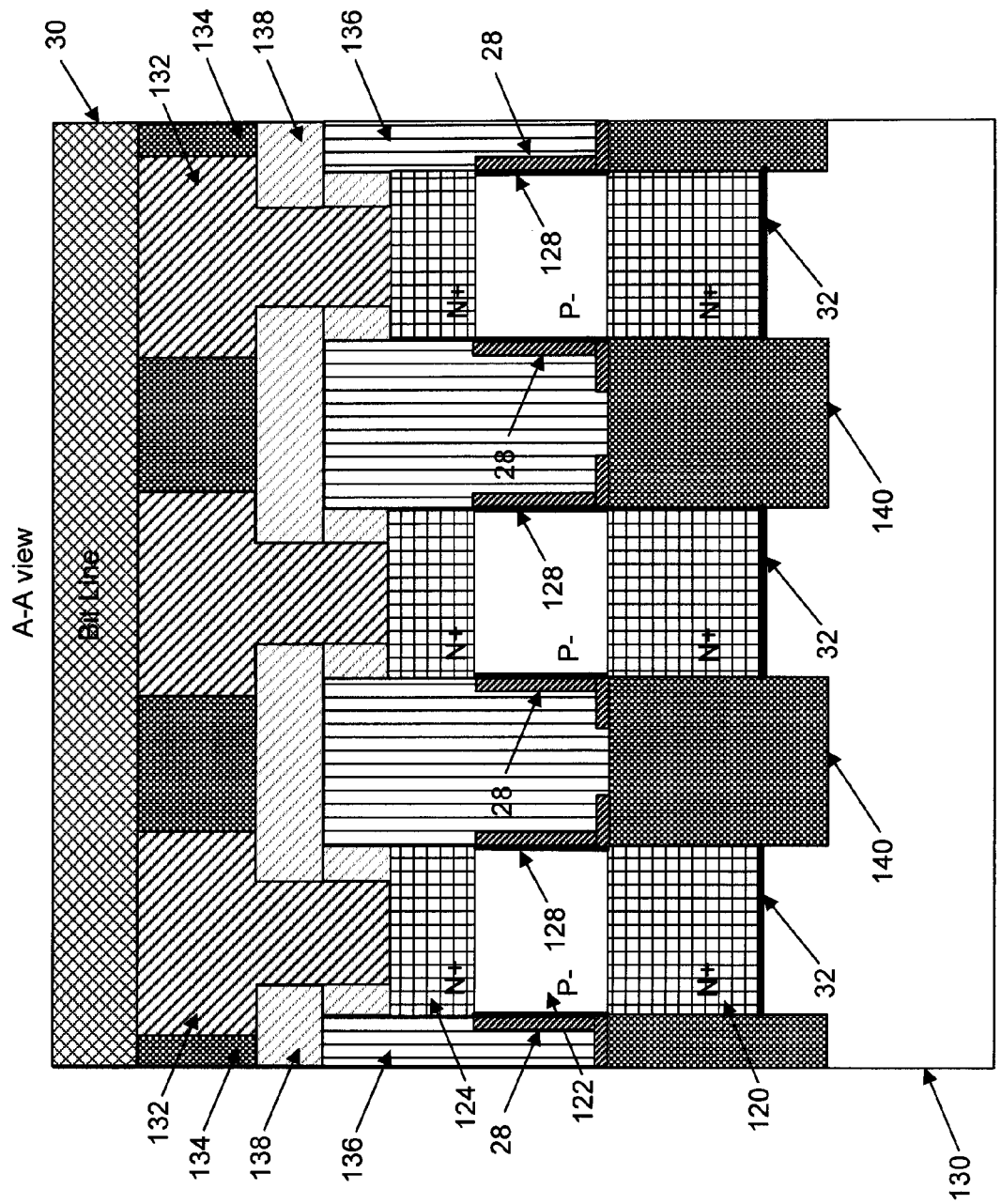
FIG. 5 shows a cross-sectional view of a portion of a memory cell array having a plurality of memory cells in accordance with a second alternative embodiment of the present disclosure.

Referring to FIG. 5, there is shown a cross-sectional view of a portion of the memory cell array 20 having a plurality of memory cells 12 in accordance with a second alternative embodiment of the present disclosure. FIG. 5 illustrates a sectional view of a column of memory cells 12 in the memory cell array 20 similar to the sectional view shown in FIG. 3, except for an alternative word line (WL) 28 configuration. As discussed above, the word line (WL) 28 may be formed of a metal layer or a polycide layer or any other conductive layer. The word line (WL) 28 may have a pair of "L" cross sectional shaped contacts located on two sides of the P− body region 122. For example, a word line (WL) 28 may be capacitively coupled to a single P− body region 122 and may not be shared between two contiguous P− body regions 122 in a column direction. In an exemplary embodiment, the word line (WL) 28 may be formed of an elongated region along a side of the P− body region 122 and a short bottom region formed on the barrier wall 140. In an exemplary embodiment, two contiguous memory cells 12 arranged in a column direction of the memory cell array 20 may not share a word line (WL) 28. For example, each word line (WL) 28 may correspond to each memory cell 12 in a column direction of the memory cell array 20. The word line (WL) 28 may be capacitively coupled to two sides of the P− body region 122 via the insulating or dielectric region 128. A voltage potential may be capacitively applied to the P− body region 122 via the word line (WL) 28 located on the sides of the P− body region 122.

The word line (WL) 28 may have a predetermined height to apply a voltage potential in order to perform one or more operations (e.g., read, write, refresh, and/or other active operation). In an exemplary embodiment, the word line (WL) 28 may have a height similar to or equal to the height of the P− body region 122. In another exemplary embodiment, the word line (WL) 28 may have a height extending beyond the height of the P− body region 122. For example, the word line (WL) 28 may have a height extending pass the bottom region of the P− body region 122 into the N+ source region 120. In another exemplary embodiment, the word line (WL) 28 may have a height extending pass the top region of the P− body region 122 into the N+ drain region 124. In other exemplary embodiments, the word line (WL) 28 may have a height extending pass both the bottom region and the top region of the P− body region 122 into the N+ source region 120 and the N+ drain region 124, respectively.

Also, the word line (WL) 28 may have a height shorter than a height of the P− body region 122. In an exemplary embodiment, a bottom region of the word line (WL) 28 may be flushed with a bottom region of the P− body region 122 while a top region of the word line (WL) 28 may be below a top region of the P− body region 122. In another exemplary embodiment, a top region of the word line (WL) 28 may be flushed with a top region of the P− body region 122 while a bottom region of the word line (WL) 28 may be above a bottom region of the P− body region 122. In other exemplary embodiments, a top region of the word line (WL) 28 may be below a top region of the P− body region 122 and a bottom region of the word line (WL) 28 may be above a bottom region of the P− body region 122.

Figure 6:
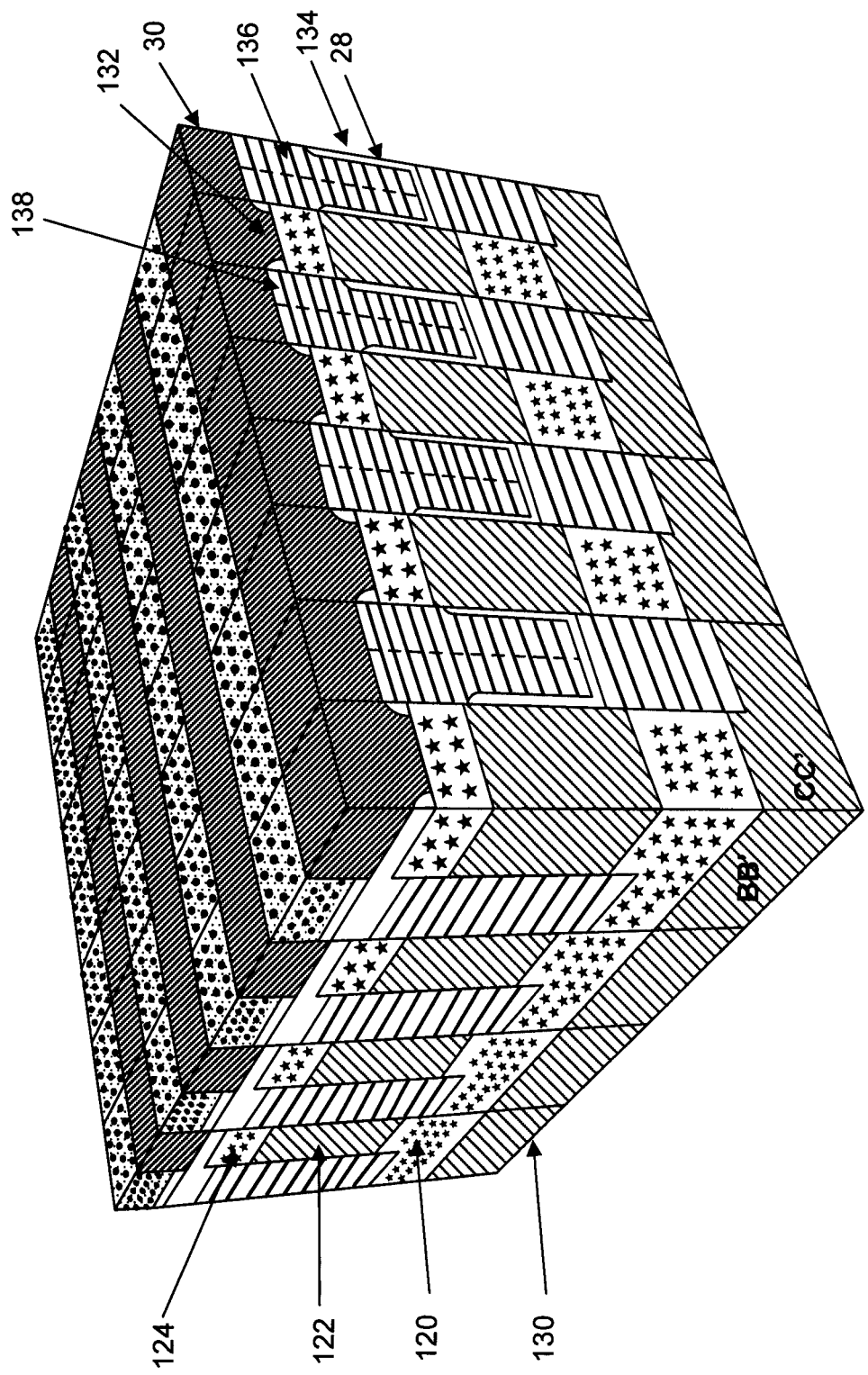
FIG. 6 shows a three dimensional view of a portion of a memory cell array in accordance with an embodiment of the present disclosure

Referring to FIG. 6, there is shown a three dimensional view of a portion of the memory cell array 20 in accordance with an embodiment of the present disclosure. For example, FIG. 6 illustrates a 4×4 array of the memory cells 12 shown in FIG. 2. As discussed above, each memory cell 12 may comprise an N+ source region 120, a P− body region 122, and an N+ drain region 124. The N+ source region 120, the P− body region 122, and the N+ drain region 124 may be disposed in sequential contiguous relationship within a pillar or fin configuration that may extend vertically or perpendicularly to a plane defined by the P− substrate 130.

Figure 7:
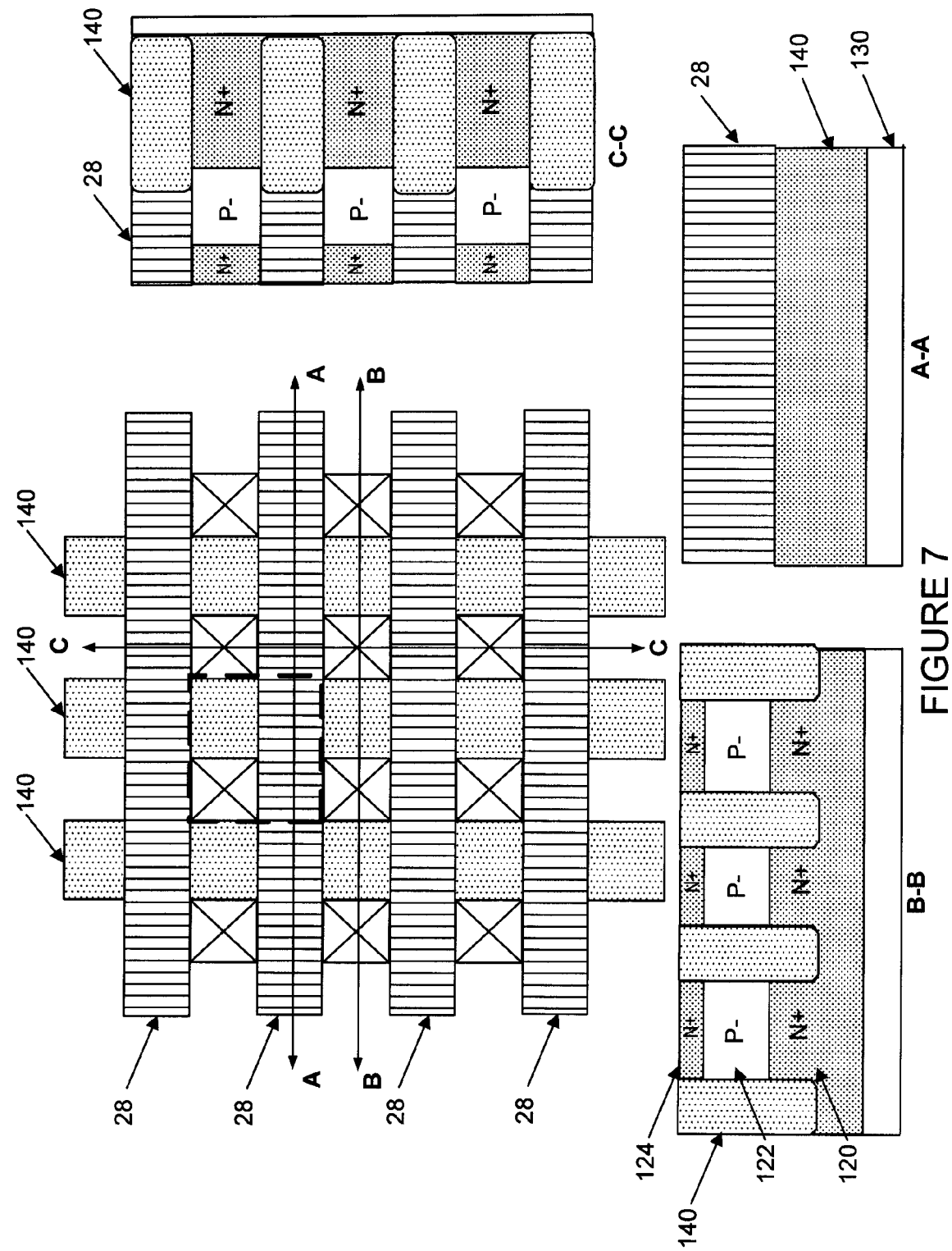
FIG. 7 shows top and cross-sectional views of a portion of a memory cell array having a plurality of memory cells in accordance with an embodiment of the present disclosure.

FIG. 7 shows top and cross-sectional views of a portion of a memory cell array 20 having a plurality of memory cells 12 in accordance with an embodiment of the present disclosure. The top view illustrated in FIG. 7 may be similar to the top view shown in FIG. 2. A plurality of barrier walls 140 may extend in a first orientation along a first plane of the memory cell array 20. Also, a plurality of barrier walls 140 may extend in a second orientation along the first plane of the memory cell array 20. The plurality of barrier walls 140 extending in the first orientation and the second orientation may form a trench region. The memory cells 12 may be formed between the trench regions of the plurality of barrier walls 140. As discussed above, each word line (WL) 28 may extend in the second orientation along a second plane of the memory cell array 20. In an exemplary embodiment, each word line (WL) 28 may be arranged between memory cells 12 of the memory cell array 20. For example, each word line (WL) 28 may be shared between contiguous memory cells 12 in a column direction of the memory cell array 20.

Sectional view A-A is taken along line (A-A) of the top view, sectional view B-B is taken along line (B-B) of the top view, and sectional view C-C is taken along line (C-C) of the top view. As shown in section view A-A, the word line (WL) 28 may be arranged on top of the barrier wall 140 extending in the second orientation. The word line (WL) 28 and the barrier wall 140 may be arranged on top of the substrate 130.

Sectional view B-B may illustrate a row of memory cells 12 in the memory cell array 20. The barrier walls 140 extending in the first orientation may separate each column of memory cells 12 of the memory cell array 20. For example, the barrier walls 140 may separate the plurality of regions of the memory cell 12 (e.g., N+ source region 120, P− body region 122, and N+ drain region 124).

Sectional view C-C may illustrate a column of memory cells 12 in the memory cell array 20 similar to the sectional view of FIG. 3. In an exemplary embodiment, each row and/or column of the memory cell array 20 may include a plurality of memory cells 12. The word line (WL) 28 may be arranged on top of the barrier wall 140 extending in the second orientation.

Figure 8:
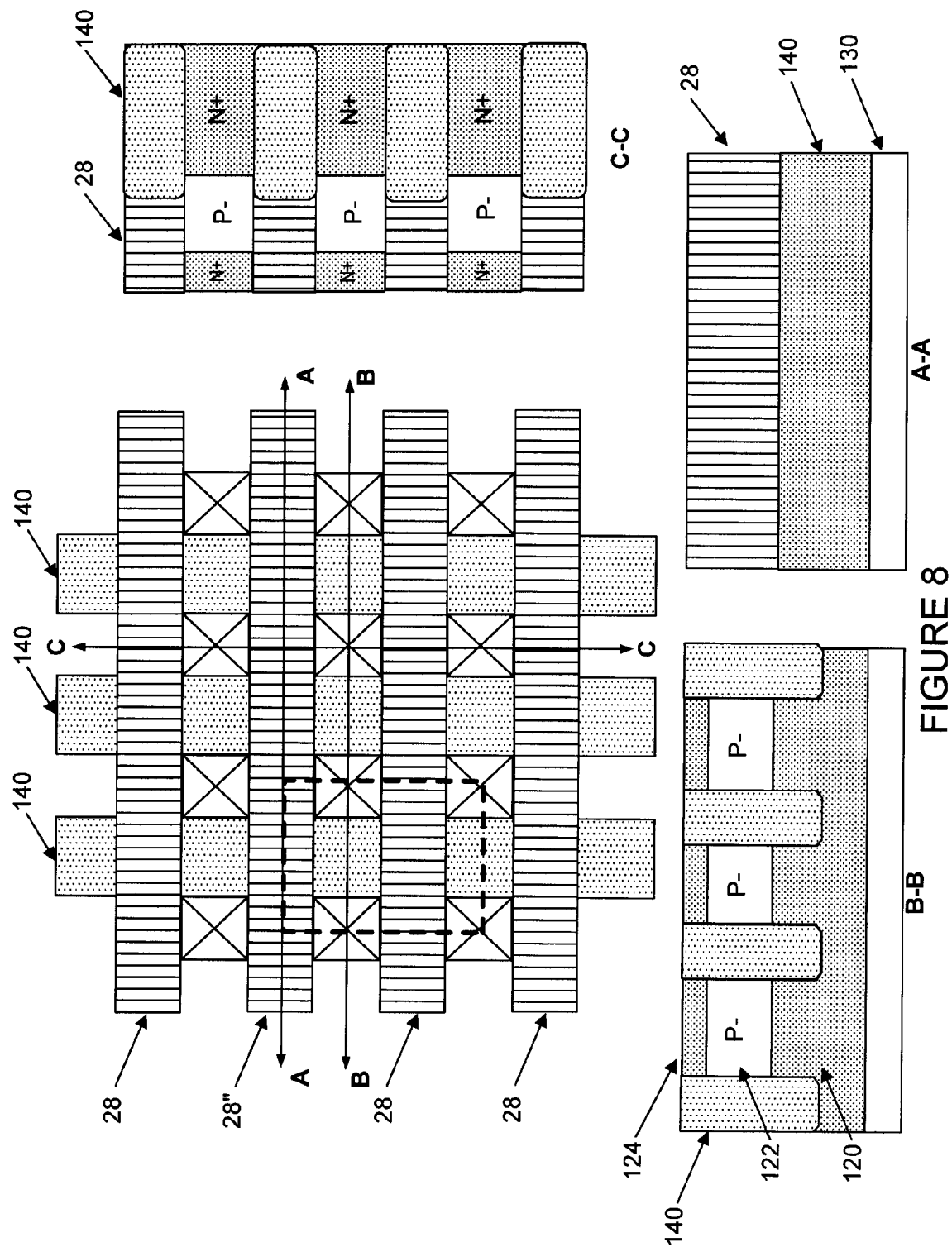
FIG. 8 shows top and cross-sectional views of a portion of a memory cell array having a plurality of memory cells in accordance with a first alternative embodiment of the present disclosure.

FIG. 8 shows top and cross-sectional views of a portion of a memory cell array 20 having a plurality of memory cells 12 in accordance with a first alternative embodiment of the present disclosure. The top view and the cross-sectional views illustrated in FIG. 8 may be similar to the top view and the cross-sectional views shown in FIG. 7. A plurality of barrier walls 140 may extend in a first orientation along a first plane of the memory cell array 20. Also, a plurality of barrier walls 140 may extend in a second orientation along the first plane of the memory cell array 20. The plurality of barrier walls 140 extending in the first orientation and the second orientation may form a trench region where the memory cells 12 may be formed.

As discussed above, each word line (WL) 28 may extend in the second orientation along a second plane of the memory cell array 20. In an exemplary embodiment, each word line (WL) 28 may be arranged between memory cells 12 of the memory cell array 20. For example, each word line (WL) 28 may be shared between contiguous memory cells 12 in a column direction of the memory cell array 20. The memory cell array 20 may have a plurality of word lines (WL) 28 extending in the second orientation. One or more of a plurality of word lines (WL) 28" may be connected to a constant voltage source while rest of the plurality of word line (WL) 28 may be connected to a variable voltage source. For example, one or more of word lines (WL) 28" may be connected to ground. In another exemplary embodiment, one or more word lines (WL) 28" may be connected to a constant voltage source applying a predetermined voltage potential. The one or more word lines (WL) 28" may be configured in a predetermined arrangement. For example, the one or more word lines (WL) 28" may be inserted for every two word lines (WL) 28.

Sectional view A-A is taken along line (A-A) of the top view, sectional view B-B is taken along line (B-B) of the top view, and sectional view C-C is taken along line (C-C) of the top view. As shown in sectional view A-A, the word line (WL) 28 may be arranged on top of the barrier wall 140 extending in the second orientation. The word line (WL) 28 and the barrier wall 140 may be arranged on top of the substrate 130.

Sectional view B-B may illustrate a row of memory cells 12 in the memory cell array 20. The barrier walls 140 extending in the first orientation may separate each column of memory cells 12 of the memory cell array 20. For example, the barrier walls 14 may separate the plurality of regions of the memory cell 12 (e.g., N+ source region 120, P− body region 122, and N+ drain region 124).

Sectional view C-C may illustrate a column of memory cells 12 in the memory cell array 20 similar to the sectional view of FIG. 3. In an exemplary embodiment, each row and/or column of the memory cell array 20 may include a plurality of memory cells 12. The word line (WL) 28 may be arranged on top of the barrier wall 140 extending in the second orientation.

Figure 9:
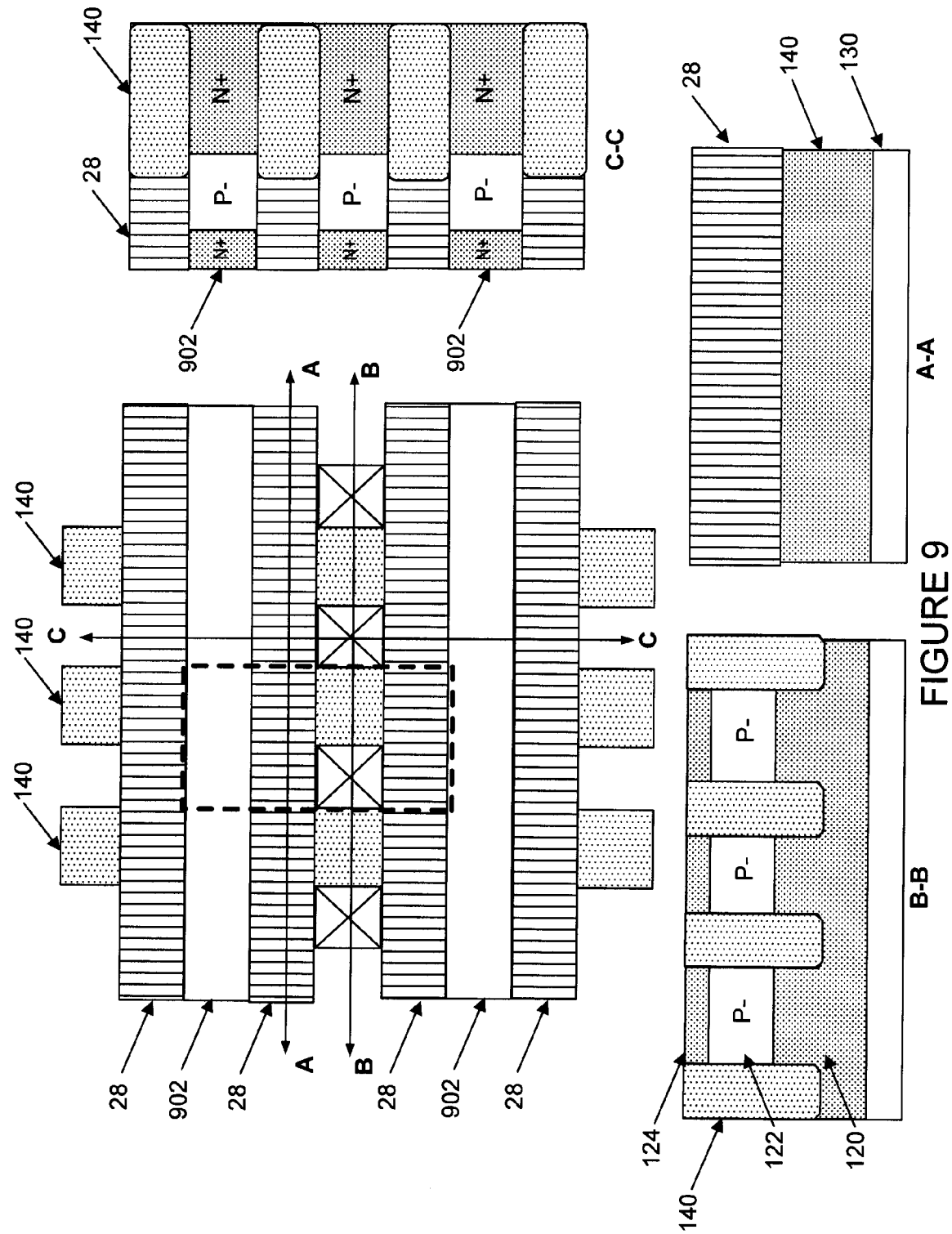
FIG. 9 shows top and cross-sectional views of a portion of a memory cell array having a plurality of memory cells in accordance with a second alternative embodiment of the present disclosure.

FIG. 9 shows top and cross-sectional views of a portion of a memory cell array 20 having a plurality of memory cells 12 in accordance with a second alternative embodiment of the present disclosure. The top view and the cross-sectional views illustrated in FIG. 9 may be similar to the top view and the cross-sectional views shown in FIG. 7. A plurality of barrier walls 140 may extend in a first orientation along a first plane of the memory cell array 20. Also, a plurality of barrier walls 140 may extend in a second orientation along the first plane of the memory cell array 20. The plurality of barrier walls 140 extending in the first orientation and the second orientation may form a trench region where the memory cells 12 may be formed.

As discussed above, each word line (WL) 28 may extend in the second orientation along a second plane of the memory cell array 20. The memory cell array 20 may have a plurality of word lines (WL) 28 extending in the second orientation. For example, memory cells 12 along a row direction of the memory cell array 20 may not share a word line (WL) 28. The word lines (WL) 28 may be configured on two sides of the memory cell array 12 in order to capacitively apply a voltage potential. In another exemplary embodiment, the word lines (WL) 28 may be configured on a dummy row 902 of memory cells 12. The dummy row 902 of memory cells 12 may enable a row of memory cells 12 to not share word lines (WL) 28 with another row of memory cells 12.

Sectional view A-A is taken along line (A-A) of the top view, sectional view B is taken along line (B-B) of the top view, and sectional view C is taken along line (C-C). For example, the word line (WL) 28 may be arranged on top of the barrier wall 140 extending in the second orientation. The word line (WL) 28 and the barrier wall 140 may be arranged on top of the substrate 130.

Sectional view B-B may illustrate a row of memory cells 12 in the memory cell array 20. The barrier walls 140 extending in the first orientation may separate each column of memory cells 12 of the memory cell array 20. For example, the barrier walls 14 may separate the plurality of regions of the memory cell 12 (e.g., N+ source region 120, P− body region 122, and N+ drain region 124).

Sectional view C-C may illustrate a column of memory cells 12 in the memory cell array 20 similar to the sectional view of FIG. 3. In an exemplary embodiment, each row and/or column of the memory cell array 20 may include a plurality of memory cells 12. The word line (WL) 28 may be arranged on top of the barrier wall 140 extending in the second orientation. Two rows of dummy memory cells 902 may be configured at contiguous rows of a row of memory cell 12.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:
1. A semiconductor memory device comprising:
   a plurality of memory cells arranged in an array of rows and columns, each memory cell having:
      a first region electrically connected to a source line;
      a second region electrically connected to a bit line; and a body region spaced apart from and capacitively coupled to a word line, wherein the body region is electrically floating and disposed between the first region and the second region;

a first barrier wall continuously extending in a first orientation of the array directly adjacent to a first side of the first region of the plurality of memory cells; and a second barrier wall extending in a second orientation of the array directly adjacent to a second side of the first region of the plurality of memory cells; wherein the second barrier wall intersects with the first barrier wall to form a trench region configured to accommodate each of the plurality of memory cells;

wherein the bit line is electrically connected to respective second regions of immediately adjacent memory cells.

2. The semiconductor memory device according to claim 1, wherein the first region and the second region are N-doped regions.

3. The semiconductor memory device according to claim 2, wherein the body region is an P-doped region.

4. The semiconductor memory device according to claim 2, wherein the body region is an undoped region.

5. The semiconductor memory device according to claim 1, wherein the first barrier wall and the second barrier wall are formed of an insulating oxide material.

6. The semiconductor memory device according to claim 1, wherein the first barrier wall and the second barrier wall are formed on a P-type substrate.

7. The semiconductor memory device according to claim 1, wherein the word line is disposed along a side of the body region.

8. The semiconductor memory device according to claim 1, wherein a height of the word line is similar to a height of the body region.

9. The semiconductor memory device according to claim 1, wherein the word line is disposed adjacent to a side of the body region and at least a portion of a side of the first region.

10. The semiconductor memory device according to claim 1, wherein the word line is disposed along a side of the body region and at least a portion of a side of the second region.

11. The semiconductor memory device according to claim 1, wherein the word line is disposed along a side of the body region, at least a portion of a side of the first region, and at least a portion of a side of the second region.

12. The semiconductor memory device according to claim 1, wherein a height of the word line is shorter than a height of the body region.

13. The semiconductor memory device according to claim 1, wherein the word line has a rectangular cross-sectional shape.

14. The semiconductor memory device according to claim 1, wherein the word line has a U cross-sectional shape.

15. The semiconductor memory device according to claim 1, wherein the word line has an L cross-sectional shape.

16. The semiconductor memory device according to claim 1, wherein the word line is capacitively coupled to a plurality of the body regions.

17. The semiconductor memory device according to claim 1, wherein the word line is coupled to a constant voltage potential.

18. The semiconductor memory device according to claim 1, wherein the word line is coupled to a ground voltage potential.

19. The semiconductor memory device according to claim 1, wherein the array of memory cells comprises a dummy row of memory cells separating adjacent rows of the memory cells.

20. The semiconductor memory device according to claim 19, wherein the bit line is connected to the second region via a bit line contact.

21. The semiconductor memory device according to claim 1, wherein the source line extends in the first orientation configured in a plane below the first region.

22. The semiconductor memory device according to claim 1, wherein the bit line extends in the second orientation configured in a plane above the second region.

* * * * *